United States Patent
Nemir et al.

(10) Patent No.: US 6,262,871 B1
(45) Date of Patent: Jul. 17, 2001

(54) FAIL SAFE FAULT INTERRUPTER

(75) Inventors: David C. Nemir; Stanley S. Hirsh; Edward Rubio, all of El Paso, TX (US)

(73) Assignee: X-L Synergy, LLC, El Paso, TX (US)

( * ) Notice: Subject to any disclaimer, the term of this patent is extended or adjusted under 35 U.S.C. 154(b) by 0 days.

(21) Appl. No.: 09/320,951

(22) Filed: May 27, 1999

Related U.S. Application Data

(60) Provisional application No. 60/086,690, filed on May 28, 1998.

(51) Int. Cl.$^7$ .................................................. H02H 3/00
(52) U.S. Cl. ............................................. 361/42; 324/424
(58) Field of Search ........................ 361/42–50; 324/423, 324/424, 418, 522, 523, 527–529

(56) References Cited

U.S. PATENT DOCUMENTS

| | | | |
|---|---|---|---|
| 3,683,302 | 8/1972 | Butler et al. | 336/83 |
| 3,736,468 | 5/1973 | Reeves et al. | 361/42 |
| 3,787,708 | 1/1974 | Hobson, Jr. | 317/18 D |
| 3,852,642 | 12/1974 | Engel et al. | 361/42 |
| 3,859,567 | 1/1975 | Allard | 361/42 |
| 3,936,699 | 2/1976 | Adams | 361/42 |
| 4,002,951 | 1/1977 | Halbeck | 317/18 D |
| 4,031,431 | 6/1977 | Gross | 361/42 |
| 4,051,544 | 9/1977 | Vibert | 361/45 |
| 4,216,515 | 8/1980 | Van Zeeland | 361/45 |
| 4,216,516 | 8/1980 | Howell | 361/42 |
| 4,255,773 | 3/1981 | Jabbal | 361/45 |
| 4,353,103 | 10/1982 | Whitlow | 361/45 |
| 4,473,859 | 9/1984 | Stone et al. | 361/93.1 |
| 4,540,859 | * | 9/1985 | Lemmer | 200/6 B |
| 4,714,975 | 12/1987 | Dvorak | 361/44 |
| 4,742,422 | 5/1988 | Tigges | 361/45 |
| 4,816,957 | 3/1989 | Irwin | 361/45 |
| 4,829,390 | 5/1989 | Simon | 361/49 |
| 4,833,564 | 5/1989 | Pardue et al. | 361/93.1 |
| 5,363,269 | 11/1994 | McDonald | 361/45 |
| 5,394,289 | 2/1995 | Yao et al. | 361/42 |
| 5,459,630 | 10/1995 | MacKenzie et al. | 361/45 |
| 5,477,412 | 12/1995 | Neiger et al. | 361/45 |
| 5,600,524 | 2/1997 | Neiger et al. | 361/42 |
| 5,642,052 | 6/1997 | Earle | 324/556 |
| 5,715,125 | 2/1998 | Neiger et al. | 361/42 |
| 5,966,280 | 10/1999 | Cerminara et al. | 361/47 |
| 5,978,191 | 11/1999 | Bonniau et al. | 361/45 |

OTHER PUBLICATIONS

United Laboratories, Inc., UL 943, Standard for Safety for Ground–Fault Circuit–Interrupters, No month, 1999.
United Laboratories, Inc., UL 943A, Practical Application Guideline for Leakage Current Protection Devices, 1999 No month.
United Laboratories, Inc., UL 1699, Standard for Safety for Arc–Fault Circuit–Interrupters, No month 1999.

* cited by examiner

Primary Examiner—Ronald W. Leja
(74) Attorney, Agent, or Firm—Jeffrey D. Myers

(57) ABSTRACT

An electronic test circuit for the self-testing of fault detection devices such as GFCI's, AFCI's and RCD's enhances the safety of such devices by automatically testing the function of all components of these detection components without the need for manual intervention. This self-test device tests the functioning of the primary circuit breaker and detects failure modes such as welded contacts in the circuit breaker. By using a secondary, "one-shot" circuit breaker, power may be safely and automatically removed from a malfunctioning fault detection device.

30 Claims, 15 Drawing Sheets

FAIL SAFE FAULT INTERRUPTER

CROSS-REFERENCE TO RELATED APPLICATIONS

This application claims the benefit of the filing of U.S. Provisional Patent Application Ser. No. 60/086,690, entitled "Fail Safe Ground Fault Interrupt", filed on May 28, 1998, and the specification thereof is incorporated herein by reference.

BACKGROUND OF THE INVENTION

1. Field of the Invention

This invention relates to an electronic test circuit that attaches to a ground fault and/or arc fault interrupt device and automatically checks for the proper functioning of the ground fault and/or arc fault interrupt device, without the need for user attention, and disables the ground fault or arc fault interrupt device in a safe condition in case of a malfunction of the device.

2. Background of the Invention

A common source of electrical injuries in the home occurs when people place radios or similar electrical devices that are operated using household AC electrical current near a swimming pool or bathtub while swimming or bathing. If a radio is knocked into water, it can create undesirable electrical leakage current through the water to ground creating what is known as a ground fault. A ground fault can also occur when a person touches an electrically hot conductor while standing on or touching a grounded conductive surface. When sufficient electrical current passes through a person, electrical burns or electrocution may result. Many electrical appliances such as heaters, hair dryers, electric razors and pumps are used near water and can present this type of hazard. Outdoor appliances such as power drills and electrically powered lawn care equipment are often subject to cut or frayed power cords that can present an electrical leakage hazard. Even a relatively low level of electrical current leakage can be dangerous to a human. Underwriters Laboratories, in their 943 standard for ground fault interrupt devices, requires that listed devices must open in response to any leakage current exceeding six milliamperes.

A ground fault is not the only class of potentially dangerous abnormal operating conditions. Another type of undesirable operating condition occurs when an electrical spark jumps between two conductors or from one conductor to ground. This spark represents an electrical discharge through the air and is objectionable because heat is produced as a byproduct of this unintentional "arcing" path. Such arcing faults are a leading cause of electrical fires. Arcing faults can occur in the same places that ground faults can occur—in fact, a ground fault would be called an arcing fault if it resulted in an electrical discharge, or spark, across an air gap. As such, a device that protects against ground faults can also prevent many classes of arcing faults.

In the United States, protection circuits known as ground fault current interrupters or GFCI's, are presently required by code for the bathrooms of most new homes and commercial buildings, as well as for garage and outdoor outlets in residential applications. In Europe, a similar device called a residual current detector, or RCD, is used for detecting and interrupting dangerous electrical leakage to ground. The theory of operation behind commercial GFCI and RCDs is the same. The major difference between the two devices is that in the U.S., most GFCIs are required to trip when leakage currents exceed 6 milliamperes while European RCDs are generally set for a trip level of 30 milliamperes.

In commercial GFCI circuits, the current carrying conductors that connect the AC source to the load will pass through a current transformer, thereby acting as primary windings for that transformer. The transformer has a secondary winding with many turns that goes to an amplifier. In a two wire system, when no electrical leakage path to ground is present, all of the electrical current that goes out one wire returns in the other wire. Accordingly, the two currents, forward and reverse, balance out one another in terms of the magnetic flux that is generated in the current transformer and so no signal is generated in the transformer secondary. On the other hand, if there is leakage to ground at the load or from the conductors connecting the source to the load, then there will be an imbalance in the currents. In other words, more electrical current goes out one wire than returns in the other, the difference being the component of current that takes another path (the ground fault current). This results in a net magnetic flux in the transformer and this will serve to generate an induced voltage in the secondary of the transformer. That secondary voltage is amplified and filtered and used to trip a relay or circuit breaker, thus removing power from the load and removing power from the leakage path. Most GFCI circuits include a reset actuator that allows the circuit breaker to be reset. Most GFCI circuits include a test button that implements an artificial leakage path around the current transformer, allowing a user to manually test the GFCI circuit, by pressing the test button and confirming operation if the internal breaker appears to open. This test does not actually confirm that an internal breaker has opened. Usually, a reset button that is mechanically connected to the relay contacts pops out and the user must assume that this means that the circuit breaker opened and the GFCI is functional.

All of the above comments also apply to GFCIs (or RCDs) that are used for multiphase systems having more than two current carrying wires. The only difference is that the additional current carrying wires are also passed through the current transformer so that in the absence of an electrical leakage path, the currents going through the transformer sum to zero.

In many electrical systems, one of the current carrying conductors will be grounded at some point in the electrical system. This grounded conductor is known as the "neutral" conductor. GFCI's will often have a circuit to detect electrical leakages from this conductor to ground by means of a second current transformer. Typically, neutral to ground faults are detected by injecting a signal onto the neutral conductor which produces an oscillation if feedback is provided through the loop completed by the neutral to ground fault.

In the United States, the National Electric Code has mandated that Arc Fault Current Interrupters, or AFCI's, be installed in certain new construction starting in the year 2002. The requirements of AFCI circuits are under development under the Underwriters Laboratories standard 1699. That standard will require that AFCI's be provided with a test circuit that simulates the arc detection circuitry output to exercise the remaining portions of the device. Since in most implementations, the AFCI will be combined with a GFCI and share much of the detection and interruption electronics, the use of a single test button for manual testing of both ground fault detection and arc fault detection will probably be common.

Ground fault current interrupts that use a differential transformer to detect the current imbalance that is indicative of a fault condition have been in use since the 1960's. U.S. Pat. No. 3,683,302 (Butler et al.) discloses a sensor for a ground fault interrupter that is operative to detect current imbalances by means of a differential transformer. U.S. Pat. No. 3,736,468 (Reeves et al.) discloses a GFCI that uses a differential sense transformer, the secondary of which is amplified to trip a circuit breaker. Other designs that combine a differential sense coil and amplifier combination to trip a circuit breaker upon fault detection include U.S. Pat. Nos. 3,852,642 (Engel et al.), 3,859,567 (Allard), 3,936,699 (Adams), 4,216,515 (Van Zeeland), 4,216,516 (Howell), 4,255,773 (Jabbal) and 4,353,103 (Whitlow).

GFCI's (or equivalently, RCD's) are required by code in many settings. In the United States, GFCI protection is required for the bathroom, garage and outdoor outlets on all new construction. The lifetime of an electrical outlet may be measured in decades but there is no assurance that a GFCI will continue to function properly over that time interval. GFCI outlets that are installed outdoors, or portable GFCI's used with construction equipment, may become encrusted with dirt or corrosion. Electronic components and insulation will age with time and this may cause a degradation in performance. A nearby lightning strike can permanently damage the fault sense electronics in a GFCI. High current demands through the outlet, even in normal use, can cause the contacts on the circuit breaker in the GFCI to weld together, subsequently preventing the circuit breaker from opening even if a fault is correctly sensed. Accordingly, there are GFCI equipped electrical outlets in service today that are not capable of delivering ground fault protection and that are thereby giving the users of such outlets a false sense of security. Although users should periodically test GFCI units, compliance is typically poor and a manual test can give misleading results or be misinterpreted by the user. As the installed base of GFCI outlets ages, the percentage of defective outlets is likely to increase. These comments apply equally to GFCI or RCD or AFCI devices used in electrical outlets, distribution panels, portable units, or units that are hard-wired into equipment.

In present day GFCI/AFCI outlets and load centers that are furnished with manual test buttons there is no way to ensure that the units are periodically tested. There is also no way to ensure that if they are tested, they are replaced if defective. Again, a manual test can give false results or can be misinterpreted by the user. Often manual testing is objectionable because if it removes power from the outlet or load center, even temporarily, it can disrupt appliances that are powered through that outlet or load center. For example, many digital clocks will be reset upon any power outage, even those caused by a temporary manual test. Accordingly, there is a need for a self-testing feature in GFCI/AFCI devices that is automatic, that is periodic, that is minimally obtrusive, and that disables the GFCI/AFCI device in a safe mode if the device cannot afford protection from a ground fault or arcing fault.

U.S. Pat. No. 4,051,544 (Vibert) describes a GFCI circuit incorporating an indicator light that turns on when, and only when, the GFCI circuit breaker opens. This invention was said to be an improvement over the prior art in that prior art devices had indicators that lit when the circuit breaker closed and thus an indicator that was burned out might lead the user to think that an outlet was dead when in fact it was electrically live. While described as a "fail safe GFCI", this invention does not check for the proper functioning of the GFCI.

The use of an automated test feature incorporated within a GFCI was suggested in U.S. Pat. No. 4,031,431 (Gross) wherein the role of the self test is to insure that the polarity on a cordset GFCI is correct for the attachment to the AC source. This invention also purportedly tests the function of the GFCI. When a control switch on the attached appliance is closed, this implements a synthetic counterbalancing fault to enable the GFCI to function and to allow power to flow to the load. A malfunctioning GFCI is indicated when the appliance continues to operate even when the control switch is in an open position. Since this testing only takes place when the appliance is manually turned off, the testing mechanism is not automatic. Using this approach does not result in fail safe operation of the GFCI.

U.S. Pat. No. 5,477,412 (Neiger et al.) describes a GFCI with built-in intelligence to detect a miswiring condition. The invention incorporates miswiring sense circuitry that automatically triggers an alarm in the case a miswiring condition is sensed. This invention does not test for the correct functioning of the GFCI.

U.S. Pat. No. 4,833,564 (Pardue et al.) describes a test circuit that adjusts the sensitivity of the GFCI to a selected threshold. The testing is not automated but is implemented when a manual test switch is engaged. The invention purportedly adjusts the magnitude of the test current so as to track changes in the sensitivity setting of the GFCI circuit. This invention does not provide for automatic testing of the GFCI, nor does it provide for fail-safe operation.

U.S. Pat. No. 5,459,630 (MacKenzie and Wafer) describes a passive test circuit that simulates neutral to ground faults and sputtering arc fault events, thus purportedly allowing a GFCI/AFCI to be fully tested. The testing is initiated through a test switch. When a test button is engaged, a bandwidth limited di/dt signal is generated and fed into the arc fault detection electronics, said bandwidth limited di/dt signal purported to simulate a sputtering arcing fault. No means is disclosed for automating these tests. No means is provided for checking for a failure in the circuit breaker.

U.S. Pat. Nos. 5,600,524 and 5,715,125 (Neiger, Gershen and Rosenbaum) describe an intelligent GFCI that periodically tests GFCI fault sensing but relies on the user to check for correct operation of the fault interruption means (the circuit breaker). This is purportedly done by setting off an audible alarm at periodic intervals, alerting the user to manually check for the proper functioning of the relay portion of the GFCI. The audible alarm then turns off when the user implements a manual test. The problems with this approach are that: (1) manual intervention is required to fully check the GFCI, with the user being responsible for recognizing whether the GFCI is correctly operating and for deciding whether to replace a malfunctioning unit; (2) with some failure modes (e.g., a welded hot side relay contact) a manual test will not detect a problem; (3) the audible alarm is obtrusive—for a residential or commercial installation with numerous GFCI's, the need to attend to beeping GFCI's might become a daily (or worse, nightly) burden; and (4) a considerable amount of consumer education will be required in order for the consumer to know that a beep means "test me" and is not an indication of malfunction. A further problem with these inventions is that the disclosed embodiments use circuit elements that are in parallel with the circuit breaker contacts, so even when the circuit breaker is open, an electrical path from source to load or source to fault will be present. In particular, if one of these parallel components were to fail in a shorted condition, opening the relay would not provide protection against a fault condition and this dangerous operating condition would not be recognized by either the self-testing electronics or by a user implementing a manual test.

A truly fail-safe fault interrupter must incorporate an emergency circuit breaker that removes power from the fault interrupter and load in the case of a malfunction by the fault interrupter. This emergency circuit breaker must be in addition to the normal or primary circuit breaker that is used to interrupt power to the load during normal operation when a ground fault condition is sensed. The reason a fail-safe fault interrupter must have this second breaker is because one common failure mode for the interrupter is when the primary circuit breaker malfunctions, thus preventing the deenergization of the load from the source. This could happen, for example, if the contacts on the primary circuit breaker were to weld together due to the so-called "hot spots" that can occur on oxidized contacts. A failure of the primary circuit breaker can also happen if the electronic switch that is used to trigger the circuit breaker fails. Malfunction can also happen due to a stuck or jammed solenoidal plunger, an open circuited or short circuited solenoid, a poor solder joint, a broken conductor or a variety of other failure sources. While the primary breaker is generally resettable, the emergency secondary breaker can be a smaller, less expensive, nonresettable "one-shot". The secondary breaker is only used to open the electrical connection when an interrupter malfunction occurs and such an occurrence will generally require that the entire unit be replaced.

A GFCI/AFCI with the self-testing feature of the present invention can eliminate the need for a manual test button or a manual reset button and may not need a resettable primary circuit breaker, but instead could use a cheaper, smaller, one-shot circuit breaker for both the primary as well as the secondary circuit breakers.

There are a variety of circuit interruption means that comprise the class of one-shot circuit breakers. The most common example is a thermal fuse, whereby two electrical conductors are in electrical contact through a low melting point linkage that opens when the current flow exceeds a certain threshold. U.S. Pat. No. 3,629,766 (Gould) describes a circuit breaker wherein a fusible wire link holds spring biased conductors in a closed position. When a predetermined electrical current is passed through the fusible link it causes it to break, effecting the snap action release of the spring arms and breaking the electrical connection. Other examples of circuit interruption means include the one-shot breaker described in U.S. Pat. No. 5,394,289 (Yao and Keung) wherein wire fuses connect two sets of two conductors. A current overload is used to break one fuse, whereupon, a cutting element is released to cut through the other fuse. U.S. Pat. No. 4,829,390 (Simon) describes a switch that is held in a normally closed position by a flash bulb. A sensor detects a dangerous condition and actuates the flash bulb, causing it to disintegrate and allowing the switch to open. Bimetallic thermal and thermal magnetic circuit breakers are well known in the art and are the basis for many resetable circuit breakers although they can be used for one-shot operation. These work by employing a blade made of two metals having different thermal coefficients of expansion. When the blade is heated, it deforms, breaking a circuit. The magnetic breakers use heating to reduce the magnetic attraction of a magnet, thereby causing a spring loaded contact to release and open a circuit. Other designs for circuit breakers include piezoelectric actuators as in U.S. Pat. No. 4,473,859 (Stone et al.) and shape memory alloy actuators as in U.S. Pat. No. 3,403,238 (Buehler and Goldstein).

SUMMARY OF THE INVENTION

The present invention is of a self-testing fault interrupt method and apparatus comprising: a) detecting an electrically unsafe operating condition via a fault sensing component; b) preventing power delivery upon the detection of an electrically unsafe operating condition via a primary electrical current interrupting component; c) employing a fault sense testing component that periodically and automatically disables the primary electrical interrupting component, applies a simulated fault, verifies that the fault sensing component correctly detects this simulated fault, removes the simulated fault, and reenables the primary electrical current interrupting component if the fault sensing component correctly detected the simulated fault; d) employing a circuit breaker testing component that, when the fault sensing component detects an electrically unsafe operating condition, automatically checks that the primary electrical current interrupting component has satisfactorily interrupted power delivery; and e) employing a secondary electrical current interrupting component that permanently removes power from the self-testing fault interrupt apparatus if the fault sense testing component does not correctly detect a simulated fault or if the circuit breaker testing component determines that the primary electrical current interrupting component has not satisfactorily interrupted power delivery. In the preferred embodiment, ground faults are detected, ground fault are simulated by imposing an electrical leakage path around a current sense transformer, and arcing faults are detected. The primary electrical current interrupting component preferably comprises a solenoidal relay and the fault sense testing component disables the primary electrical current interrupting component by disabling an actuating solenoid on the solenoidal relay. The primary electrical current interrupting component preferably comprises a solenoidal relays, bimetallic thermal circuit breakers, thermal magnetic circuit breakers, piezoelectric acutuated circuit breakers, shape memory alloy circuit breakers, or circuit breakers employing a fusible link. The secondary current interrupting component can employ a one shot circuit breaker and can interrupt both or only one of two current carrying conductors. The secondary current interrupting component can employ solenoidal relays, bimetallic thermal circuit breakers, thermal magnetic circuit breakers, piezoelectric actuated circuit breakers, shape memory alloy actuated circuit breakers or circuit breakers employing a fusible link. The secondary current interrupting component can employ conducting blades that are forced apart by an insulating wedge to interrupt power flow, with the conducting blades connecting the insulating wedge to a spring held in compression by a low wattage resistor, and releasing the spring when a high electrical current is passed through the low wattage resistor. Outlets with or without manual test and reset switches may be employed in conjunction with the invention.

Prior art approaches to self-testing in ground fault current interrupts are complicated; are not completely automated; do not test for a malfunctioning circuit breaker; and do not fail safe. In particular, for fail safe operation, a failure of any one individual component in the system may not result in a device that will be unsafe if a ground fault occurs. Accordingly, the present invention has the following objects and advantages:

a. It automatically and periodically checks for the correct operation of the ground fault sensing circuitry;

b. The self-testing electronics are completely independent of the GFCI/AFCI electronics;

c. The self-testing electronics can be added as a retrofit to some existing GFCI/AFCI circuits with minimal or no redesign;

d. The self-testing works independent of any manual test button that may optionally be present and the user is not relied upon to be an element of the testing routine or to be responsible for identifying a malfunctioning GFCI/AFCI;

e. The automatic testing does not disrupt the functioning of any appliances that may be powered through the GFCI/AFCI;

f. The invention requires only a small number of relatively low cost components to implement;

g. Using the present invention, a person cannot be injured by a ground fault unless both the GFCI/AFCI portion and the self test circuit are damaged. If either one is functional then protection is afforded;

h. The present invention will protect against injury even in the case of a failure of the GFCI/AFCI primary circuit breaker; and i. The use of the present invention reduces and may eliminate the need for a manual test button and manual reset button and the attendant costly, and bulky mechanical components associated with having mechanical interlocks and latches for ensuring safe resetting after a manual test.

It is a general object of the present invention to provide an automatic self-testing feature for ground fault current interrupt circuits and arc fault current interrupt circuits that removes power from the GFCI/AFCI and the load when a circuit malfunction in the GFCI/AFCI is detected.

It is another object of the present invention to implement this self-testing automatically without human intervention.

It is another object of the present invention to implement the self-testing circuit with a minimal number of electronic components, thereby containing cost, complexity and avoiding the introduction of numerous additional failure modes.

It is another object of the present invention to provide a testing circuit that is independent of the electronics in the GFCI/AFCI portion of the circuit and that can be implemented as a retrofit to existing GFCI/AFCI circuits.

It is a further object of the present invention to provide protection against injury in case of failure of the GFCI/AFCI circuit breaker, and in particular, if a solenoid for the circuit breaker is shorted or stuck or if the circuit breaker contacts fail to open.

It is a further object of the present invention to eliminate the need for a manual test and manual reset means for the GFCI/AFCI, thereby eliminating some of the expense and mechanical complexity associated with prior art devices.

None of the prior art embodiments, either alone or in combination, anticipates the present invention. Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

LIST OF REFERENCE NUMERALS

Figure 1:
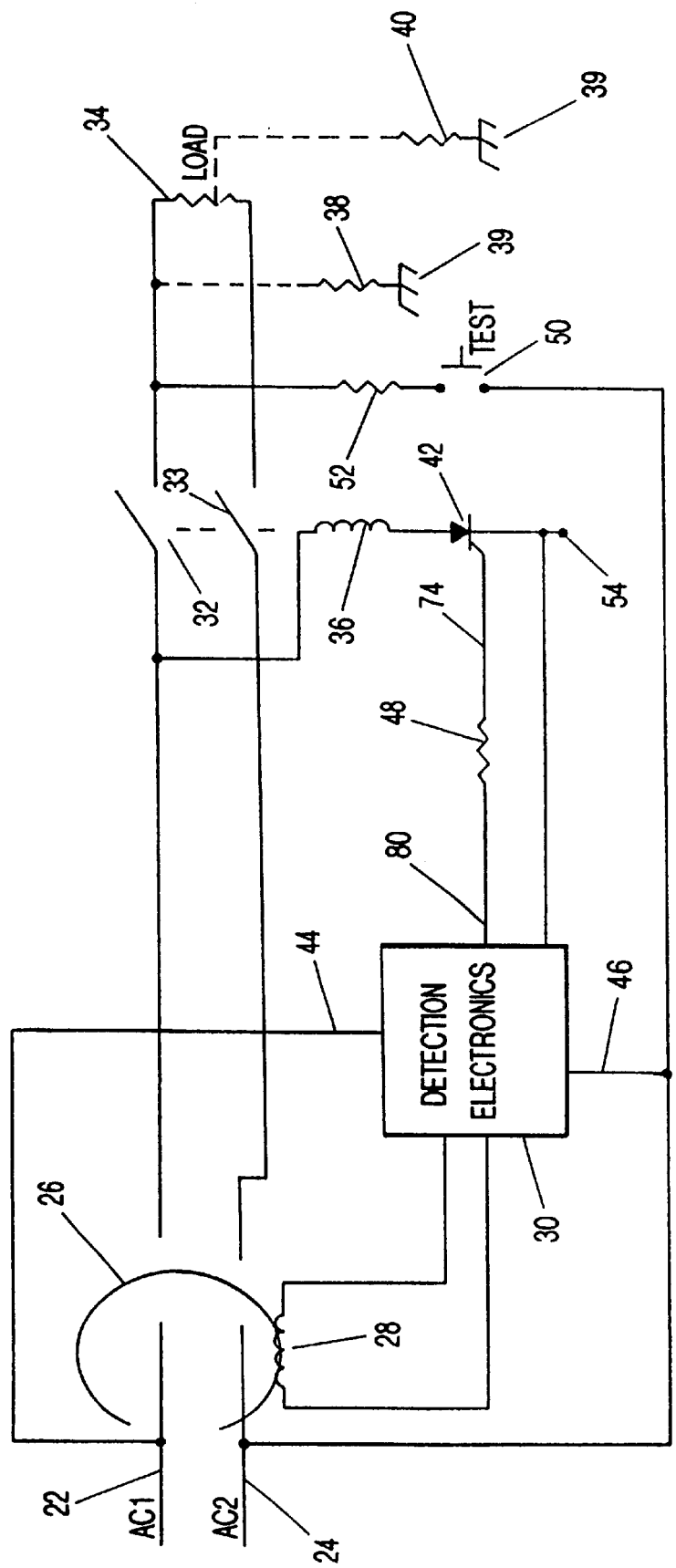
FIG. 1—Block diagram of prior art GFCI circuit.

22—AC1 source conductor
24—AC2 source conductor
26—Current sense transformer
28—Secondary winding of current sense transformer
30—Detection electronics
32—Hot side circuit breaker contact
33—Neutral side circuit breaker contact
34—Load
36—Solenoid
38—Load side electrical leakage path
39—Earth ground
40—Electrical leakage path from load to ground
42—Primary relay trigger SCR
44—Power connection of the amplifier to AC1
46—Power connection of the amplifier to AC2
48—Current limiting resistor connecting amplifier to SCR gate
50—Manual test button
52—Fault test resistor
54—SCR cathode
56—Self test circuit control block
57—Conventional GFCI
58—AC1' source conductor
60—AC2' source conductor
62—AC1 to test circuit
64—AC2 to test circuit
66—Hot side secondary circuit breaker
67—Neutral side secondary circuit breaker
68—Trigger for secondary circuit breaker
70—Fault sense signal
72—SCR disable connection
74—SCR gate
75—Connection to AC1 conductor on load side of current sense transformer
76—Fault resistor for automatic test
78—Control for self-test switch for fault test
80—Fault detection trigger output from detection electronics
82—Electronic switch for fault test
84—Decision block "has fault occurred?"
86—Delay block to allow circuit breaker time to open
88—Decision block "Is fault being sensed?"
90—Block to activate secondary circuit breaker
92—Decision block "Time for self-test?"
94—Block to disable primary circuit breaker SCR gate
96—Block to apply a test fault
98—Decision block "Is fault sensed?"

100—Block to remove test fault
102—Block to enable primary circuit breaker
104—Block to reinitialize timer
106—Metal oxide varistor
108—Full wave bridge
110—Power sourcing resistor
112—Node for positive DC power
114—Filter capacitor
116—Reference node for DC power supply
118—Amplifier/filter
120—Detection electronics block (detail)
122—Coupling capacitors
124—Filter capacitor for SCR gate
126—SCR disable switch
128—Test circuit
130—Microcontroller
132—Dropping resistor
134—Rectifier diode
136—Charge capacitor
138—Dropping resistor
140—Power supply capacitor
142—Zener diode
144—Resistor to AC line
146—Inhibit line
148—Optocoupled transistor
150—Optocoupled transistor
152—Test button
153—Optocoupled Triac
154—One shot control line
155—Test fault resistor
156—Resistor
158—Pull up resistor
160—Disable transistor
162—Base resistor
164—Resistor
166—Diode
168—SCR
170—Cathode to gate resistor
172—Fault sense input
173—One shot circuit breaker
174—Breaker actuator
175—Circuit breaker contact
176—Circuit breaker contact
177—Resistor
178—Neon
179—Resistor
180—Source terminal block
182—Screw
184—Threaded hole
186—Electrical insulating structure
188—Rivet
190—Conducting blade
192—Printed circuit board with GFCI electronics
194—Solenoid
196—Secondary windings of sense transformer
198—Contact points
200—Rivet holding AC source terminal to PC board
202—Printed circuit board
204—Rivet holding blade to printed circuit board
206—Copper pad
208—Conductors
210—Insulating wedge
212—Slotted track
214—Springs
216—Carbon composition resistor
218—Hole in printed circuit board
220—Hole in insulating wedge
222—Male connectors from self-test printed circuit board
224—Female connectors on GFCI printed circuit board
226—Shape memory alloy wire
228—Post
230—Stationary structure
232—Large pin
234—Compression spring
236—Slide attached to insulating wedge
238—Back plate connected to insulating wedge
240—Small pin
242—Extension of stationary structure into wedge
244—Permanent outer shell
246—GFCI/AFCI component
248—Test button
250—Reset button

DESCRIPTION OF THE PREFERRED EMBODIMENTS

FIG. 1 gives a block diagram that functionally describes the majority of present day GFCI circuits. This is the prior art circuit that is the basis for almost any GFCI found in the home or in commercial and industrial construction. The incoming conductors from the source are the AC1 22 and AC2 24 conductors. In the U.S., one of these conductors (for this discussion the AC2 conductor 24) is generally required by code to be grounded at a distribution panel and is known as the "neutral" conductor. In such a system, the ungrounded current carrying conductor is often called the "hot" conductor. Conductors 22 and 24 pass through a differential current sense transformer 26 and thereby act as the primary for that transformer. The secondary 28 of current sense transformer 26 connects to the detection electronics 30, which may filter and/or amplify and/or otherwise process the voltage from the secondary windings 28 of the current sense transformer 26. The detection electronics draw power from connections 44 and 46. In normal operation, electrical current is delivered to the load 34 through circuit breaker contacts 32 and 33. In some applications, such as in a load distribution panel, there is a single circuit breaker contact 32 for interrupting electrical current on the ungrounded conductor and there is no circuit breaker contact 33 (equivalently, circuit breaker contact 33 is always in a closed position). For a system with two circuit breaker contacts 32 and 33, circuit breaker contacts 32 and 33 are closed during normal operating conditions but are driven to be in an open condition by solenoid 36 if a ground fault condition is detected.

In normal operation in the absence of a ground fault, the same amount of electrical current flows in the AC1 and AC2 conductors 22 and 24, but in opposite directions. The net flux in the differential current sense transformer 26 is near zero and the voltage that is generated in the transformer secondary 28 is zero. When a load side electrical leakage path 38, occurs from the AC1 conductor to ground or an electrical leakage path 40 occurs from within the load 34 to ground 39, then there is a current imbalance between conductors 22 and 24. This results in a net magnetic flux that is induced in the differential current sense transformer 26. This results in a nonzero voltage being generated in the secondary 28. The detection electronics 30 then takes in this voltage signal and processes it to determine whether a current imbalance (a fault) of sufficient magnitude and/or duration has occurred. If the detection electronics 30 determines that the fault is of sufficient magnitude and/or duration, then it triggers an SCR 42 into conduction which causes current to flow through the solenoid 36, thereby opening the circuit breaker contacts 32,33. In FIG. 1, the SCR cathode 54 will generally connect, within the detection electronics 30, to AC2 24, directly or through one or more series resistors and/or diodes. A current limiting resistor 48 may be used to connect the detection electronics 30 to the gate 74 of the SCR 42. In some implementations, there will be no current limiting resistor 48 but an amplifier output within the detection electronics 30 will connect directly to the gate 74 of SCR 42 (equivalently, current limiting resistor 48 is a short). In some implementations, the SCR 42 will be replaced by an alternative electric switching element such as a triac or a transistor or an optically isolated switching element.

Test button 50 allows a manual test of the proper operation of the fault sensing/interrupting circuitry. When test button 50 is engaged, it implements an electrical leakage path that goes around the differential current sense transformer 26. The amount of electrical leakage is determined by the resistance value of the fault test resistor 52. This deliberately applied electrical leakage causes a current imbalance that is sensed by the detection electronics 30 and then triggers the primary relay SCR 42 which energizes the solenoid 36, thereby causing the circuit breaker contacts 32,33 to be opened. A user can thus manually test the GFCI by engaging the test button 50 and listening for the relay contacts 32,33 to open and/or observing a visual indicator (for example, in many implementations, the reset button will pop up). The visual indicator can be misleading since with some failure modes, e.g., a single welded hot side contact, the reset button may still pop up during a manual test, leading a user to incorrectly believe that the GFCI is offering fault protection. In many implementations, the relay has a reset mechanism that can be manually engaged to reclose the relay after it has opened. In many implementations, the GFCI will have a second current sense transformer (not shown) that will be used to detect a neutral to ground fault. Generally, if the GFCI has a manual test means, this test means will be directed at detecting a hot to ground fault and will not test for the correct function of the neutral to ground fault detection.

While the above discussion has centered around a ground fault detection circuit, an arc fault simulation circuit can be built into the detection electronics 30 and be triggered by the manual test button 50 to implement a manual arc fault test.

Figure 2:
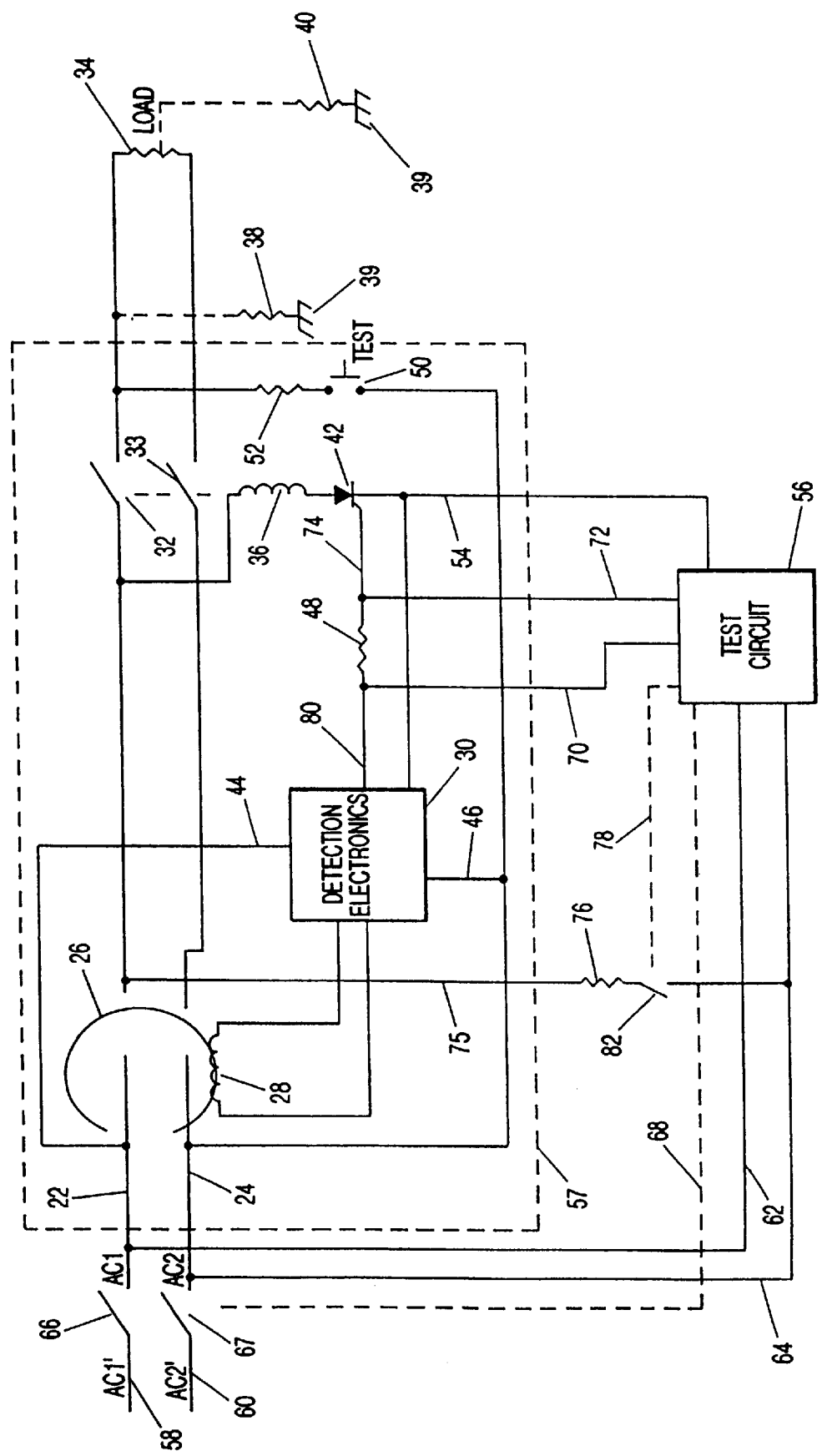
FIG. 2—Block diagram of GFCI with attached test circuit.

FIG. 2 depicts a block diagram of a conventional GFCI (dotted box 57) with the self-test circuit 56 of the present invention added. One of the important features of the present invention is that it can be added as a retrofit to an existing GFCI design. This is seen by the fact that the self-test circuit 56 connects to the existing GFCI circuit in four places (at the two sides of resistor 48, to the SCR cathode 54, and through conductor 75 to the AC1 conductor on the load side of the current sense transformer 26), without otherwise affecting its operation. Part of the test circuitry entails the addition of a secondary circuit breaker 66 and 67 that serves to interrupt power by breaking the connection between respectively, conductors 58 and 22 and between conductors 60 and 24. In some embodiments, particularly for a GFCI/AFCI in a load center, it may not be desirable to interrupt current flow on the neutral side, in which case circuit breaker 67 would be replaced by a direct electrical connection between the AC2' source conductor 60 and the AC2 source conductor 24. The secondary circuit breaker 66 (and optionally 67) is nominally in a closed state unless triggered to open by the self-test circuit 56 via a trigger signal 68. The self-test circuit 56 receives its power from the AC source through conductors 62 and 64.

During normal operation when the self-test circuit 56 is not active, the connections to lines 70 and 72 are in a high impedance condition and have no effect on the normal functioning of the GFCI. At periodic time intervals, an automatic test is implemented by the self-test circuit 56. During the automatic test, first the self-test circuit 56 automatically disables the primary relay SCR 42 by tying the SCR gate 74 to a potential at or near the potential at SCR cathode 54. This is done via the SCR disable connection 72. While the SCR 42 is disabled, an artificial fault is implemented by engaging switch 82, which applies a test resistance 76 to AC2' 60 around the current sense transformer 26. If the GFCI is correctly sensing a fault condition, this should result in a high going voltage triggering signal on conductor 80. This would normally result in the firing of SCR 42 but does not do so during a self-test because line 72 is disabling the SCR gate 74. If the self-test circuit senses a high going voltage via conductor 70 that is of sufficient magnitude and duration that it would normally trigger the primary relay trigger SCR 42, this means that the GFCI correctly sensed a fault condition and everything in the GFCI up to this trigger output 80 is functioning correctly. The self-test has been passed, test switch 82 is put back into an open condition, thereby removing the test fault, and line 72 is then placed back into a high impedance condition, thereby enabling the normal operation of the GFCI.

If, on the other hand, while a test fault 76 is engaged through switch 82 during a self-test, the detection electronics 30 does not generate a trigger voltage at line 70 of sufficient magnitude and duration, this indicates that there is a malfunction within the sensing portion of the GFCI. In this event the self-test circuit 56 opens the secondary circuit breaker via control line 68, thereby removing power from the GFCI 57 and the load 34.

Accordingly, the self-test circuit 56 periodically and automatically checks for the proper functioning of the fault sense portion of the GFCI. This leaves the circuit interruption component of the GFCI, including the primary relay trigger SCR 42, the solenoid 36, the circuit breaker contacts 32,33 and any connections between them, untested. The circuit interruption portion of the GFCI is tested at any time that the GFCI trigger output 80 becomes active when a self test is not being implemented. When a self test is not being implemented, then line 72 is in a high impedance state, enabling the SCR 42. Any fault that is sensed, including a legitimate fault to ground 38 or a fault 40 from load to ground, or a test fault 52 that is implemented via the manual test button 50, should result in a signal at the output 80 of the detection electronics 30 that will trigger the SCR 42, energizing the solenoid 36 and thus causing the circuit breaker contacts 32,33 to open.

Accordingly, at any time that a self-test is not being carried out and the test circuit detects a trigger signal through conductor 70, it signifies an event that should cause the circuit breaker contacts 32,33 to open, thereby removing the fault condition and causing the trigger signal 80 to become inactive after sufficient time has elapsed to allow the circuit breaker contacts 32,33 to fully open (which would remove the leakage path so that no fault would be sensed). If, after a time interval that is long enough so that the circuit breaker 32,33 should have opened in response to a fault, the trigger signal 80 is still in an active condition, this indicates that the fault condition has not been removed. This can happen for a variety of reasons, including, but not limited to, one or more welded contacts in the circuit breaker, a broken conductor, a malfunctioning SCR 42, or because the fault occurred on the GFCI side of circuit breaker contacts 32,33. For whatever reason, if a fault of significant magnitude has been sensed but the fault condition has not been removed within a certain interval, then this is indicative of a failure of the GFCI and the self-test circuit 56 triggers the secondary circuit breaker contacts 66,67 to go into an open state by means of trigger 68.

The above discussion has not addressed testing for a neutral to ground fault condition. In many GFCI's, a second current transformer will be added, generally adjacent to the first current sense transformer, to sense a neutral to ground fault condition. Neutral to ground faults are often detected by injecting a signal onto the neutral conductor which produces an oscillation if feedback is provided through the loop completed by the neutral to ground fault. This feedback then serves to cause an amplifier within the GFCI to recognize a fault condition. This neutral to ground protection is important because it protects against the occurrence of a grounded neutral on the load side of the GFCI circuit breaker and helps ensure that a GFCI outlet is correctly wired. However, for a correctly wired GFCI, a neutral to ground fault is seldom a shock hazard since the potential difference between neutral and ground is generally less than a volt. Accordingly, most commercial GFCI's do not include a manual test button to test for the response to a neutral to ground fault. It would be obvious to one skilled in the art that the previous discussion can be extended to the inclusion of neutral to ground protection within the GFCI and the inclusion of an additional electronic test switch to implement a test neutral to ground fault.

The above discussion has not addressed the self-testing of an arc fault detection/interruption capability. AFCI's will generally be combined with GFCI's and will share the same circuit interruption means (circuit breaker contacts 32,33, solenoid 36, SCR 42, etc.) and possibly some of the same detection electronics. It would be obvious to one skilled in the art that the previous discussion can be extended to the inclusion of arc fault self-testing.

Figure 3:
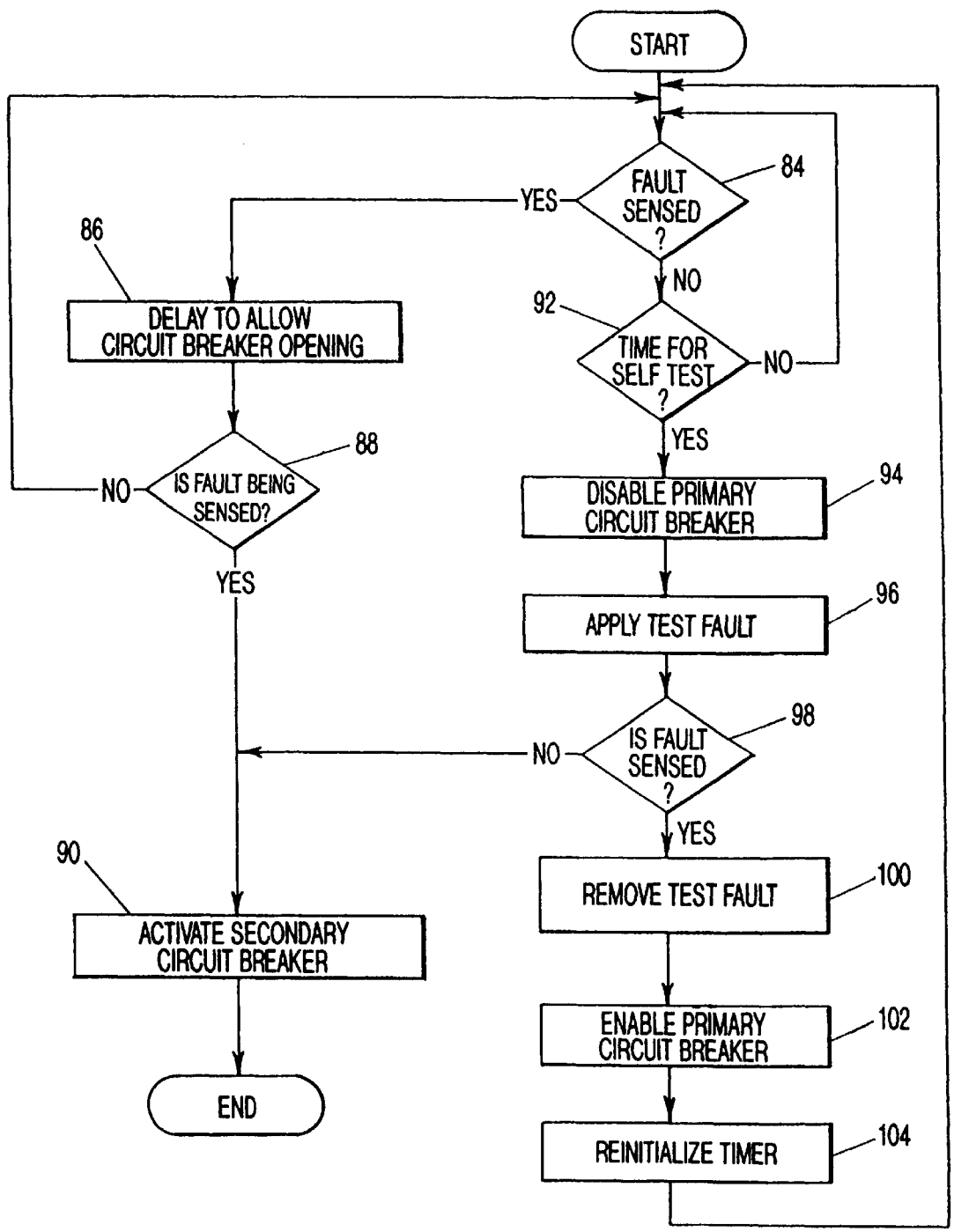
FIG. 3—Flowchart for self-testing GFCI

FIG. 3 depicts a flow chart for the sequence of tasks that should be carried out by the self-test circuit 56 of FIG. 2. In the main loop, the tester looks for whether a fault has been detected 84. If yes, this indicates either a ground fault has occurred or that a manual test has been initiated. After a delay 86 sufficient to allow the primary circuit breaker to open in response to a fault, the tester again looks for whether a fault is being detected 88. If the answer is again yes, then clearly, the primary interruption means of the GFCI is not properly functioning and the tester proceeds to activate the secondary circuit breaker 90, thereby removing power from the GFCI, the load and any leakage paths to ground.

In the main loop, when the tester checks for whether a fault has been detected 84, if no fault has been detected then it checks to see if enough time has elapsed to initiate a self-test 92. In practice, this time delay governs how often the fault detect electronics are checked and this time interval may be set to any arbitrary amount from seconds to days. If sufficient time has elapsed, then a self-test is performed by first disabling the primary circuit breaker 94 and then applying a test fault 96. If a fault is sensed 98 this indicates that the fault sense electronics are functioning correctly, so the test fault is removed, 100, the primary circuit breaker is enabled 102, the timer is reinitialized 104, and the cycle repeats. If, on the other hand, no fault is sensed 98 after a test fault is applied 96, this indicates that the fault sense electronics are defective and the secondary circuit breaker is activated 90 to force the removal of power from the system and placing the system in a safe condition.

The two main branches of the flow chart in FIG. 3 embody the essence of this invention. The ability to sense a fault is continually checked in the main loop so that at any time there is confidence that this portion of the circuit works. Then, when a fault is sensed due to external factors (either a true fault or a manual test) the correct functioning of the relay is checked by verifying that after a brief time interval the fault condition is removed. If the fault condition is not removed, this is indicative of a defective GFCI and power is permanently removed.

Figure 4:
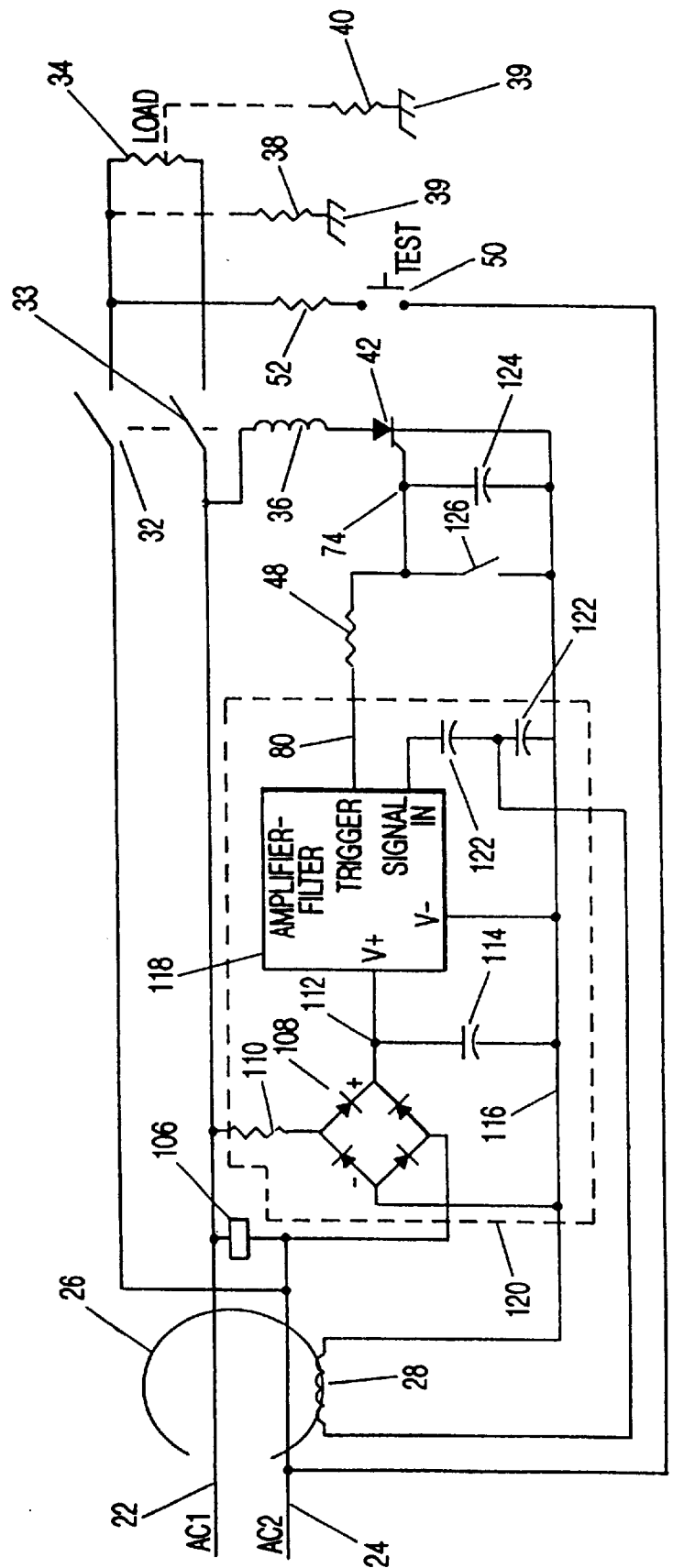
FIG. 4—Specific embodiment of a commercially available GFCI (Prior Art).

FIG. 4 depicts a specific embodiment of a commercially available GFCI circuit. As in previous figures, the source conductors AC1 and AC2 (22 and 24) pass through the current sense transformer 26, thereby forming the primary side of the transformer. A metal oxide varistor 106 serves to act as a low impedance shunt to high voltage spikes, thereby affording protection to the electronics in the GFCI. Full wave bridge 108 serves to full wave rectify the incoming alternating current. Some of the voltage from the line is dropped across the power sourcing resistor 110, thereby ensuring that the DC voltage at node 112 is at a relatively low 12 to 16 volts. Filter capacitor 114 connects between the positive DC node 112 and the reference node for the DC power supply 116. The amplifier/filter 118 is generally implemented on a single integrated circuit. The dotted box 120 represents the detection electronics block 30 of FIG. 1 and FIG . 2.

In FIG. 4, capacitors 122 serve to couple the signal from the secondary 28 of the differential transformer 26 to the amplifier/filter 118. Capacitor 124 serves to filter out high frequency noise, thereby preventing an accidental firing of the primary relay trigger SCR 42. The trigger output 80 connects to the gate 74 of SCR 42 through a current limiting resistor 48. In many commercial GFCI's an SCR disable switch 126 is present. This switch automatically engages when the circuit breaker contacts 32,33 open, thereby shorting the gate of the primary trigger SCR 42. This ensures that the current is removed from the solenoid 36 after the relay opens, protecting the solenoid 36 from being continuously energized and preventing nuisance trips when the GFCI is manually reset. Often the mechanical breaker is constructed in such a way as to only allow the breaker contacts to close with the reset actuator released (prevents breaker from being held closed while a fault is present).

Figure 5:
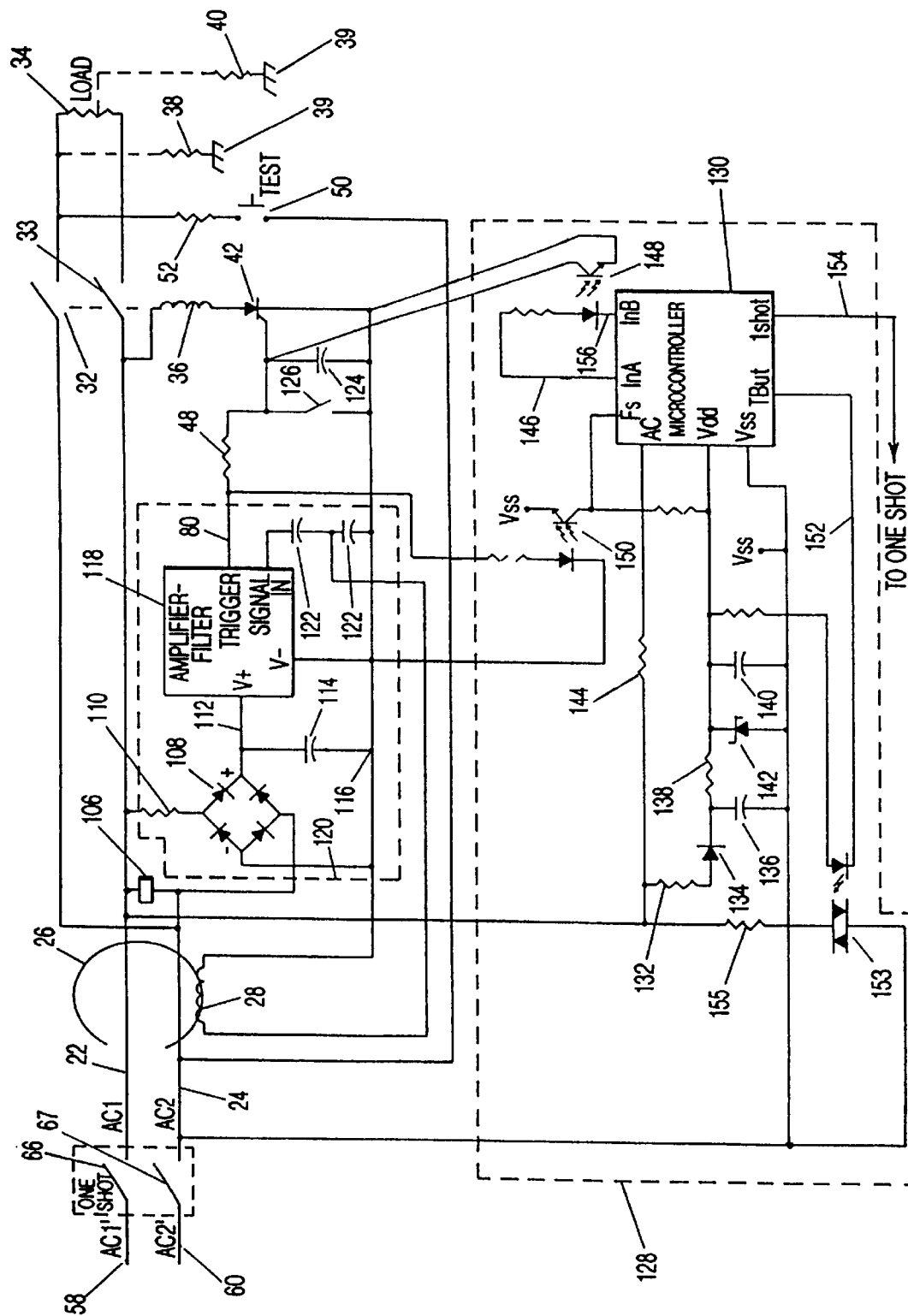
FIG. 5—First specific embodiment of automatic, self-testing GFCI.

FIG. 5 depicts a first preferred embodiment of the automatic, self-testing GFCI circuit. The dotted box 128 corresponds to the self-test circuit 56 from FIG. 2. The microcontroller 130 forms the heart of the self-test circuit and implements all timing and control features. The microcontroller 130 can be a single integrated circuit. The microcontroller receives its power at terminals Vdd and Vss. Vdd is approximately 5 volts relative to Vss (which is tied to AC2) and is generated from the incoming AC by using a dropping resistor 132 into a rectifying diode 134 to a charge capacitor 136. The voltage across the charge capacitor 136 is then filtered and regulated by the dropping resistor 138, the power supply capacitor 140 and the zener diode 142.

The self-test circuit 128 is added as a separate, independent item and is designed to have minimal impact on the function of the original GFCI. In particular, the manual test button 50 and manual reset mechanisms can be unchanged. The microcontroller 130 implements timing from the AC line to which it is connected through a resistor 144. AC line voltage cycles are generally very stable in frequency. By counting the zero crossings of this line, the microcontroller can implement timing functions.

The microcontroller implements a test of the fault sense electronics by carrying out the steps outlined in the flowchart of FIG. 3. First, it disables the primary relay trigger SCR 42 by placing inhibit line A 146 in a high state and inhibit line B 156 in a low state. This serves to trigger an optocoupled transistor 148 that disables the SCR 42. Next, the microcontroller implements a test fault by placing the test button output 152 at a Vss potential. This serves to energize the optocoupled triac 153 which then implements a test fault of a magnitude governed by resistor 155. This test fault results in an imbalance of currents through current sense transformer 26 since the test path goes through the transformer 26 via the AC1 conductor 22 but returns to AC2 24 without going through the transformer 26. Finally, the microcontroller 130 checks the status at optocoupled transistor 150 to see if a fault has been recognized. At any time that the GFCI is detected as being damaged or malfunctioning, the microcontroller energizes the one shot line 154 to permanently remove power from the entire system. When the test is over, the microcontroller places inhibit line A 146 in a low state and inhibit line B 156 in a high state. The purpose of two inhibit lines to control optocoupled transistor 148 is so in case of failure of the overall test circuit 128, the optocoupled transistor 148 will be unlikely to be placed in a mode where it disables the SCR 42. Should transistor 148 fail in a disabling mode, the test circuit will detect this as a failure of the main breaker in an actual fault condition, and will fire the one-shot, permanently removing power from the GFCI and the load.

In the embodiment in FIG. 5 the GFCI portion of the system is completely independent of the test circuit 128. Each subsystem has its own independent power supply. The only interface between the two circuits is via optical coupling. Accordingly, a failure in one circuit does not electrically alter the other circuit with the exception of optocoupled transistor 148 which is equipped with two control lines in order to make it unlikely to be a failure mode. Should transistor 148 fail in a disabling mode, the test circuit will detect this as a failure of the main breaker in an actual fault condition, and will fire the one-shot thus causing the system to fail safe.

Figure 6:
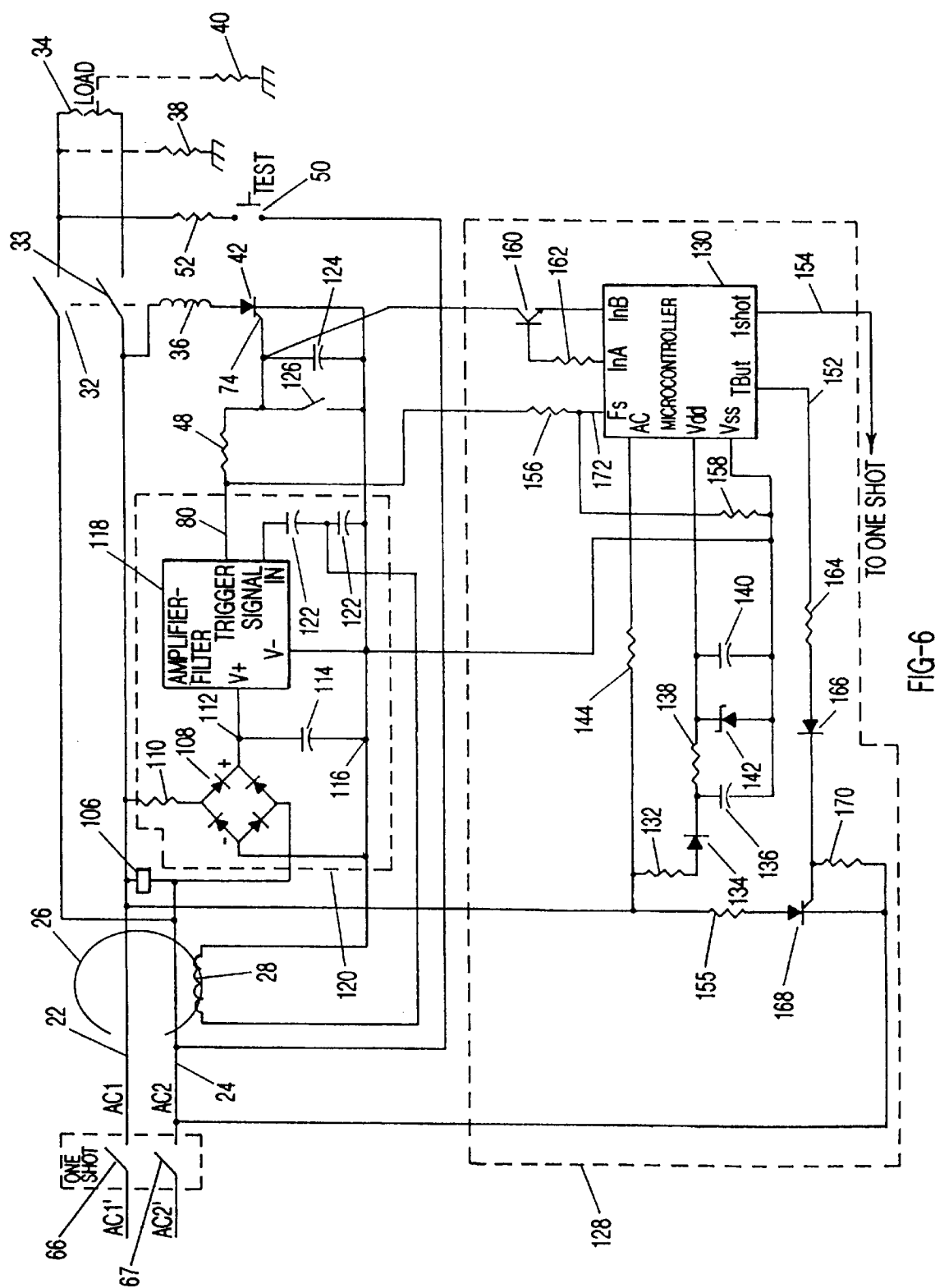
FIG. 6—Second specific embodiment of automatic self-testing GFCI.

FIG. 6 depicts a second preferred embodiment of the self-testing GFCI. The main distinction between FIG. 5 and FIG. 6 is that the embodiment in FIG. 6 does not require relatively expensive optocoupled components. Instead, in the embodiment in FIG. 6, the reference potential for the test circuit 128 is tied to the reference node 116 for the GFCI. This enables all signals from the GFCI and test circuit to be at the same voltage levels.

The power supply in FIG. 6 functions identically to that of FIG. 5. During the testing sequence, first the microcontroller disables the relay trigger SCR 42 by tying the base high and the emitter low of transistor 160. This serves to short out the gate 74 of SCR 42. Next, a test fault is implemented using the test output 152. This implements a fault by triggering SCR 168. Finally, the fault sense is monitored at the sense input 172 on the microcontroller 130. As before, if a malfunction of the GFCI is sensed, the one shot 154 is triggered.

The embodiment in FIG. 6 can be built using a PIC 12C508 microcontroller which is commercially manufactured by the Microchip company. One of the advantages to this microcontroller is that it has an internal watchdog timer that is independent of the oscillator used to carry out the microcontroller timing. The watchdog timer will periodically generate an interrupt, forcing the system into an initialization sequence unless it is disabled periodically within the microcontroller software. Accordingly, it provides a layer of safety in case the microcontroller is "glitched" due to electrical noise. Due to the limited burden on the microcontroller, the choice of the microcontroller would likely be dictated by cost. Alternatively, the logic could be implemented by one or more commercially available integrated circuits or application specific integrated circuits.

Figure 7:
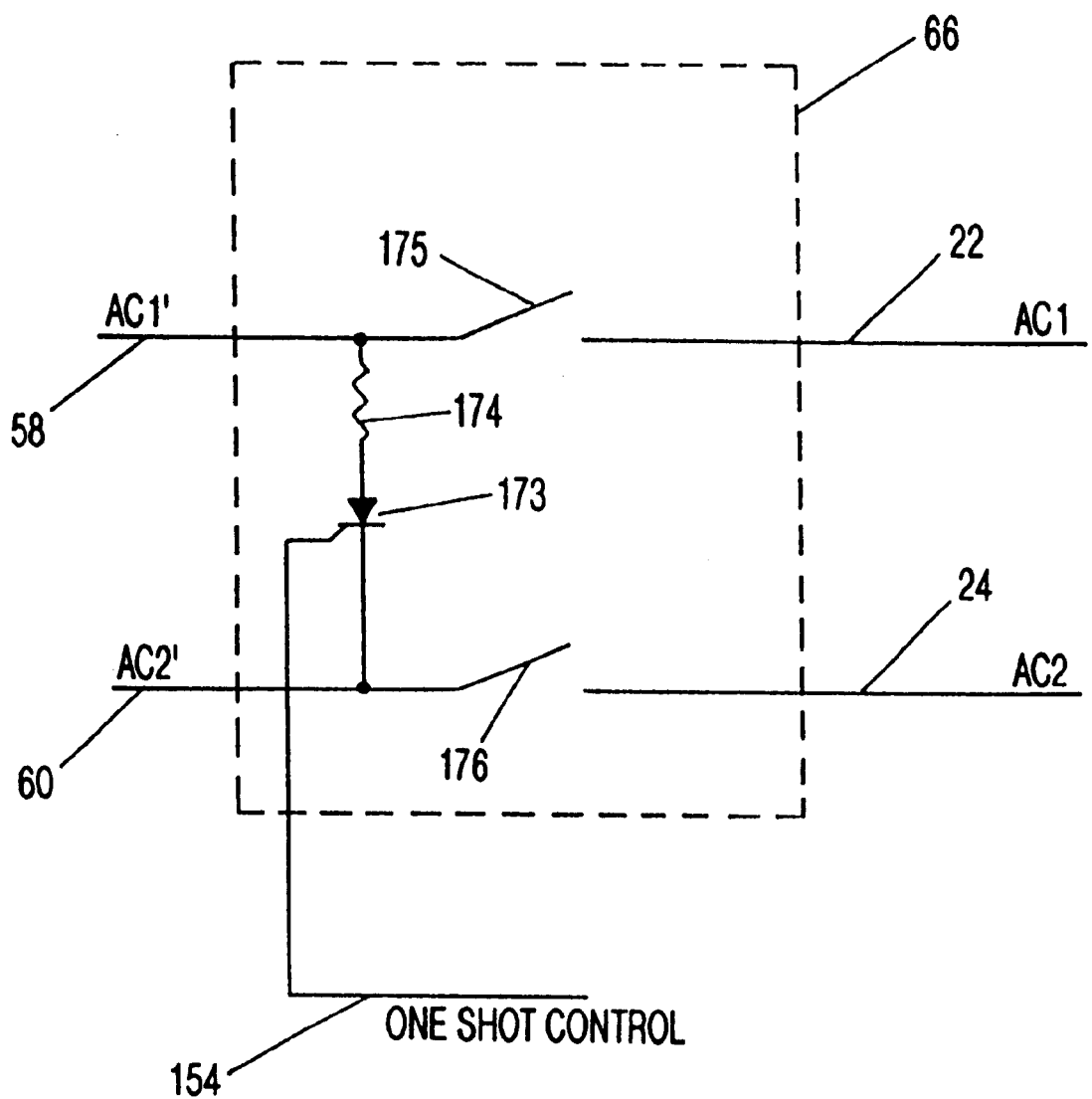
FIG. 7—Detail of one-shot circuit breaker control.

FIG. 7 depicts a preferred embodiment for the one-shot circuit breaker 66,67. The one-shot control line 154 is used to trigger an SCR 173 that allows a current flow through breaker actuator 174. The breaker actuator 174 is depicted as a resistor and in some embodiments may, in fact, be a resistor whose function is to disintegrate due to high power when the SCR 173 is fired, thereby releasing a mechanism that opens the one-shot contacts 175 and 176. The breaker actuator 174 may also be a shape memory alloy wire, which when heated due to current flow within the wire, changes its shape, thereby releasing a mechanism that opens the one shot contacts 175 and 176. It will be obvious to one skilled in the art that the breaker actuator could also be a relay coil, a bimetallic strip, a piezoelectric actuator, or another type of electrical element that causes a mechanical response when energized.

Figure 8B:
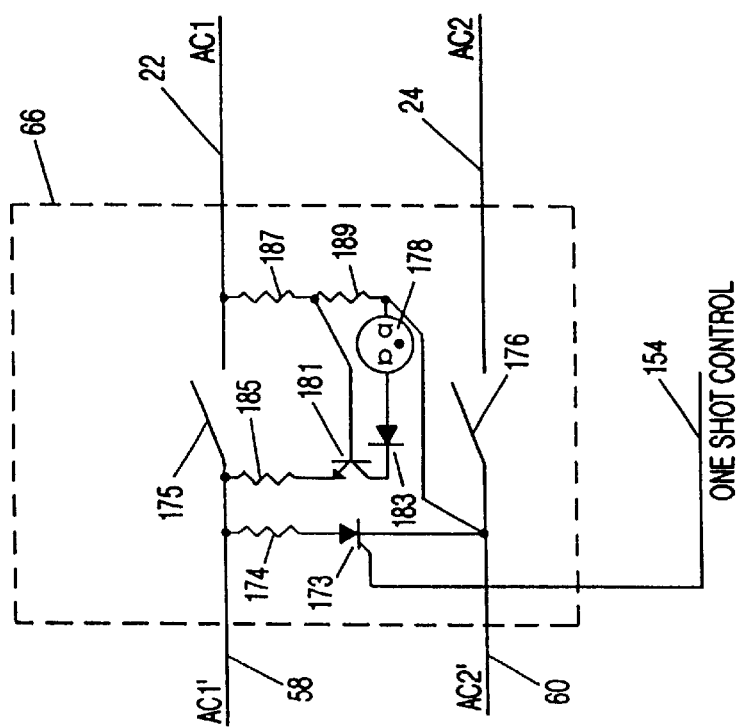
FIGS. 8a & 8b—Details of two one-shot breaker controls with indicators.
Figure 8A:
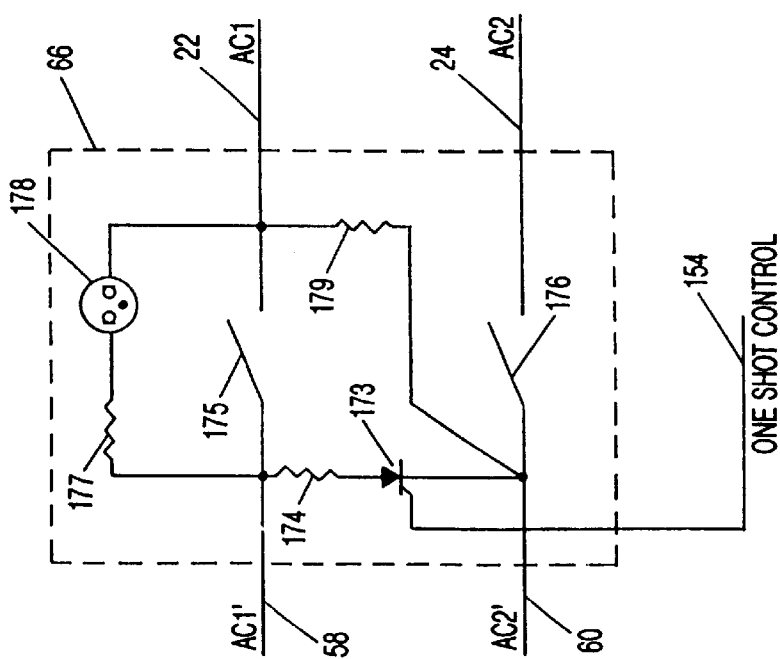

FIG. 8a is identical to FIG. 7 except that electronic circuitry has been added to indicate when the one-shot breaker is in an open condition. This could be used to indicate to a user that a malfunction has occurred. A neon indicator 178 serves to give a visual indication when the breaker contact 175 is open. The current to neon 178 is limited by a limiting resistor 177. A second resistor 179 which connects from AC1 to AC2', serves to give a path for current flow through the neon 178 when both contacts 175 and 176 are open. Resistors 177 and 179 should be chosen to be relatively large in resistance value so as to limit any fault currents. In a 115 VAC electrical system, one possible set of values is to choose a value of 47 kilohm for resistor 177 and a value of 68 kilohm for resistor 179.

FIG. 8b depicts a one-shot breaker with a different type of indicator. In this system, when breaker contact 175 is closed, the NPN transistor 181 is in an off condition because the base of transistor 181 has a voltage that is lower than the emitter. As such, no current flows through the neon 178. When the breaker contact 175 opens, the base voltage on the transistor 181 increases to turn on transistor 181 during the half cycles when AC2' is positive with respect to AC1'. This causes an appreciable current to flow through the neon 178, causing it to turn on during these half cycles. The emitter resistor 185 serves to limit the current through the neon 178 and ensures that the transistor 181 is turned off when contact breaker 175 is in a closed state. Diode 183 protects the transistor 181 from being damaged due to reverse currents on alternating half cycles.

Figure 9:
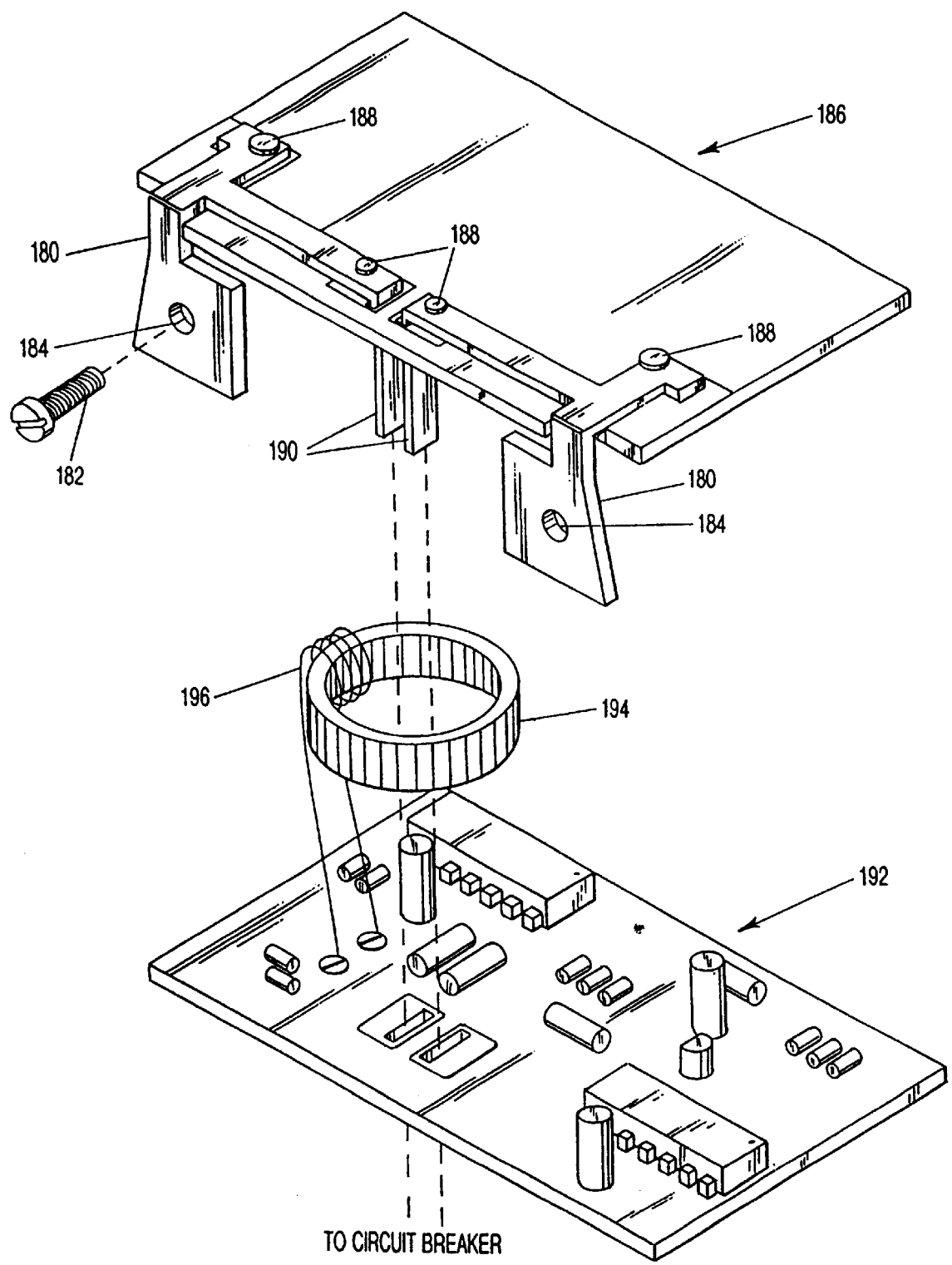
FIG. 9—Mechanical layout of a portion of a prior art GFCI device.

FIG. 9 depicts the mechanical layout of a prior art GFCI. This layout is functionally equivalent to many commercially available GFCI devices. The source terminal blocks 180 are locations to which current carrying conductors from the AC source are attached. The attachments are generally made by using a screw 182 to attach wires from the AC source, screwing into a threaded hole 184. An electrical insulating structure 186 is used to mechanically secure the source terminal blocks 180 and to keep them isolated from one another. One or more rivets 188 may be optionally used to secure the source terminal blocks to the electrical insulating structure 188. Two conducting blades 190 that are electrically connected respectively to each of the two source terminal blocks 180, extend down through a printed circuit board 192. These blades 190 make an electrical connection to the printed circuit board 192, thereby furnishing power to the electronics therein. The electrical connection can be via soldering or can be a press fit. The blades 190 also pass through a solenoid 194, thus acting as the primary side of a transformer wound on the solenoid 194. The secondary windings 196 of this transformer connect to the GFCI electronics. The blades 190 that are electrically connected to the AC source, go through the printed circuit board 192 to connect to one side of the primary circuit breaker (not shown). The other side of the primary circuit breaker then connects to output, or load, terminals (not shown). In FIG. 9, the other electronic components shown on the printed circuit board 192 are for illustration only and may not correspond to the actual electronics on a GFCI device.

Figure 10:
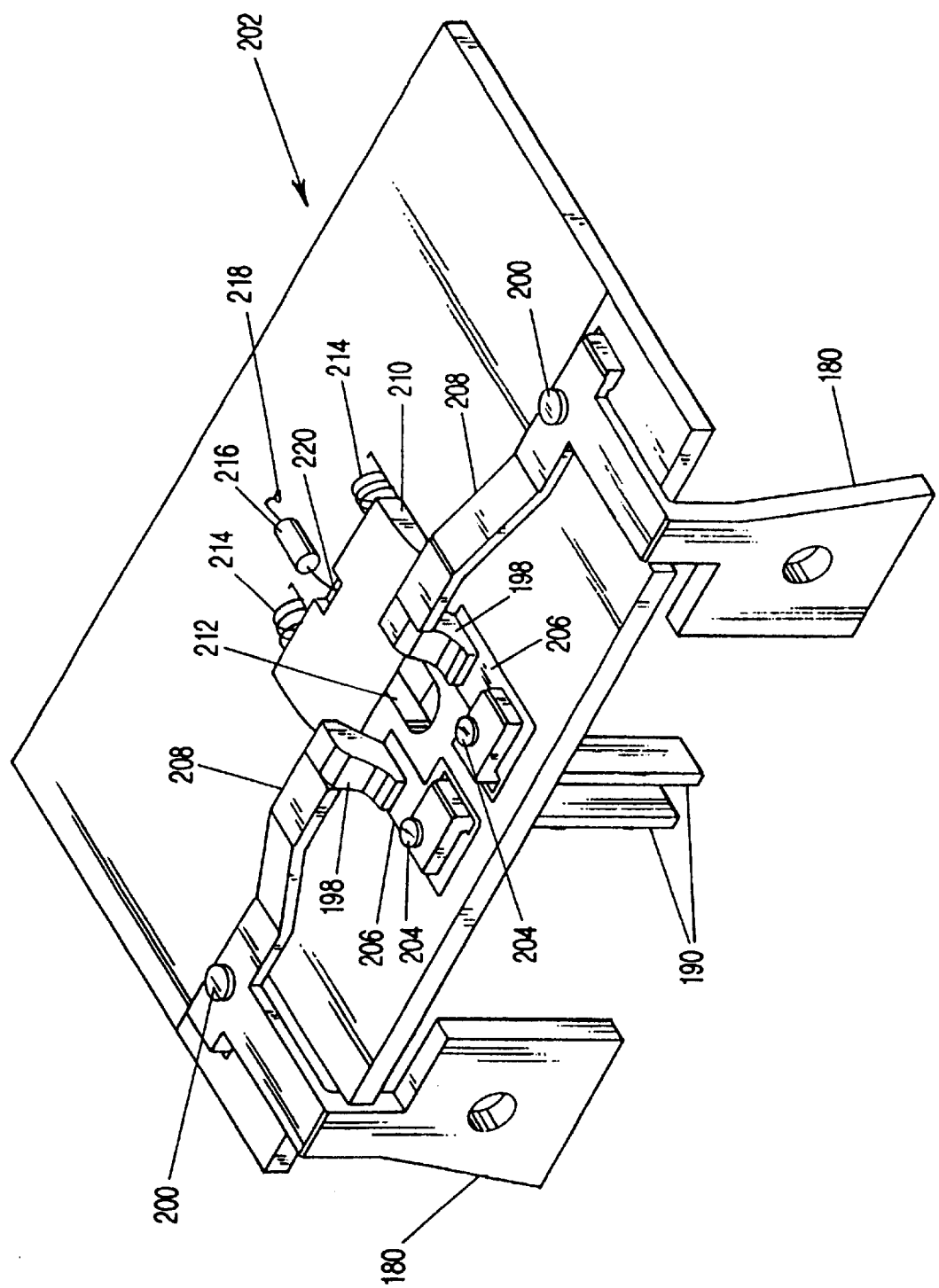
FIG. 10—First specific embodiment of a one-shot breaker.

FIG. 10 depicts a preferred self-testing retrofit circuit embodiment of the invention. This assembly would replace the electrical insulating structure 186 and source terminals 180 of the previous FIG. 9. In FIG. 10, the source terminals 180 perform the same function as previously, serving as a mounting point for the incoming AC conductors. In normal operation, when the GFCI circuit is functioning normally, the source terminals 180 connect electrically to the blades 190 through contact points 198. Rivets 200 serve to hold the source terminals 180 secure to a printed circuit board 202. Rivets 204 serve to hold the blades 190 secure to the printed circuit board 202 and to ensure that the blades 190 do not make electrical contact with one another. Rivets 204 also assist in making a solid electrical connection between the blades 190 and copper pads 206 on the printed circuit board 202. Contact points 198 are normally held against copper pads 206 by the spring pressure of conductors 208, which act like leaf springs.

A spring loaded insulating wedge 210 is held in place by a slotted track 212 in the printed circuit board 202. When the self test electronics detect a dangerous operating condition, the wedge 210 is forced between the contacts 198 and the copper pads 206, serving to break the electrical connection. The wedge 210 can move in the direction of the slotted track 212 but a protrusion in the bottom of the wedge 210 serves to prevent the wedge from twisting or slipping out of the slotted track 212. The insulating wedge 210 may be made out of teflon, Delrin or some other electrically insulating material. Two springs 214 are positioned between the back of the insulating wedge 210 and the printed circuit board 202. These springs 214 serve to apply a bias force on the wedge 210 in a direction so that they would cause the contact points 198 to open. The wedge 210 is prevented from moving in reaction to these springs 214 by a quarter watt carbon composition resistor 216 which is mechanically connected to the printed circuit board 202 through a hole 218 and is mechanically connected to the wedge 210 through a hole 220. When the self test detects a dangerous operating condition, a high current is passed through the resistor 216, causing it to disintegrate, and thereby allowing the springs 214 to force the wedge between the contact points 198 and the copper pads 206, breaking the electrical connection and removing power from the blades 190, and consequently, removing power from the GFCI electronics and the load.

Figure 11:
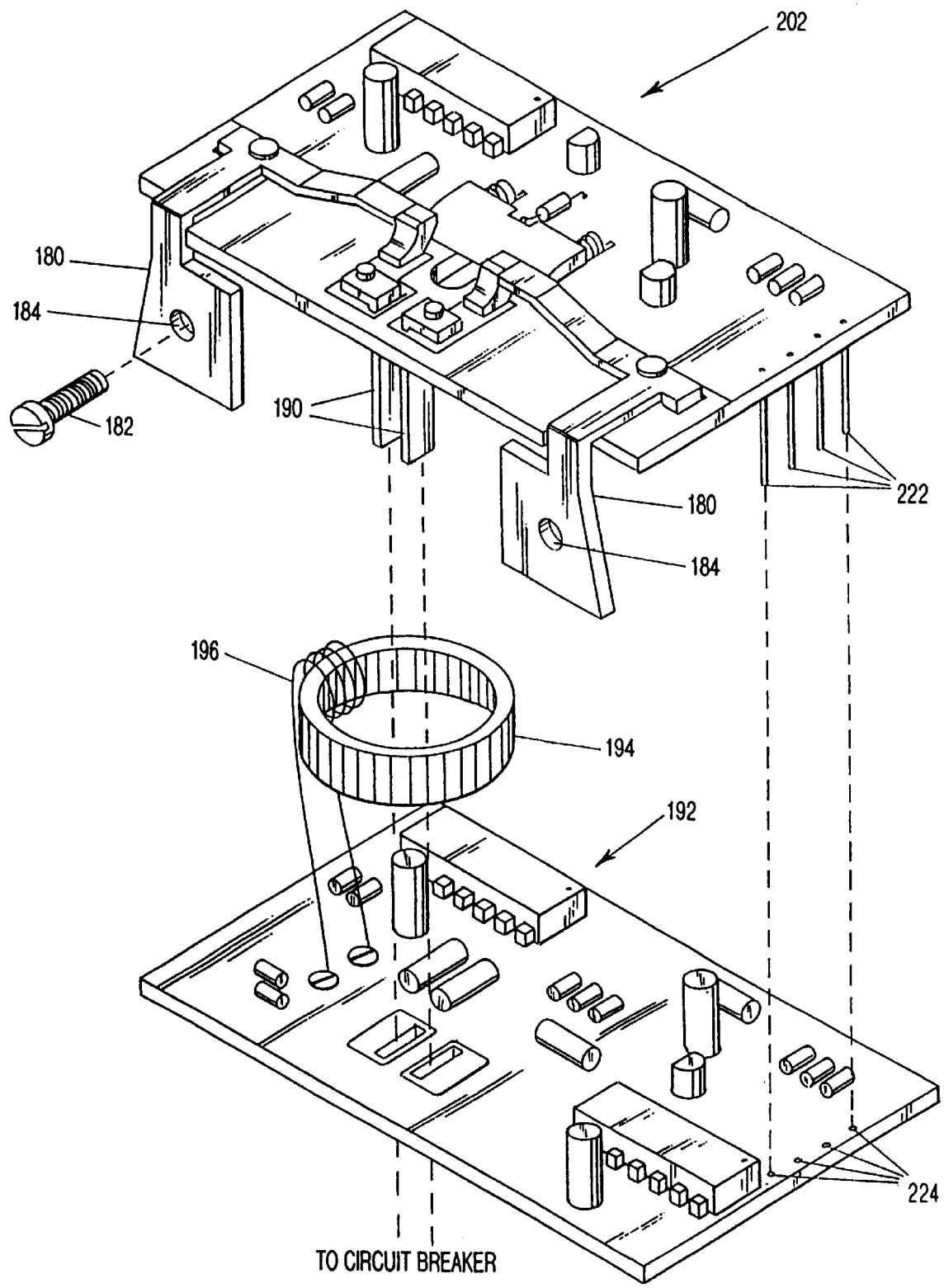
FIG. 11—Mechanical layout of GFCI with self-tester added as a retrofit.

FIG. 11 depicts one way in which the invention can be implemented as a retrofit with an existing GFCI circuit. In FIG. 11, the printed circuit board 202 contains the electronic components necessary to implement the self-test. The electronic components that are depicted are for illustration only and do not necessarily correspond to the actual components that would be used. Four connections must be made from the self-tester electronics on the printed circuit board 202 to the printed circuit board with GFCI electronics 192. These connections may be made via male connectors 222 on the self-test printed circuit board 202 to female connectors 224 on the GFCI printed circuit board 192. Two of these connections go to either side of the current limiting resistor connecting amplifier to SCR gate. A third connection attaches to the ACI conductor on the load side of the solenoid. A fourth connection attaches to the cathode of the primary relay trigger SCR.

By comparing FIGS. 9 and 11, it is seen that a conventional GFCI device can be easily converted to a self-testing GFCI device by simply replacing the electrical insulating structure 186 with a self-test PC board 202.

Figure 12:
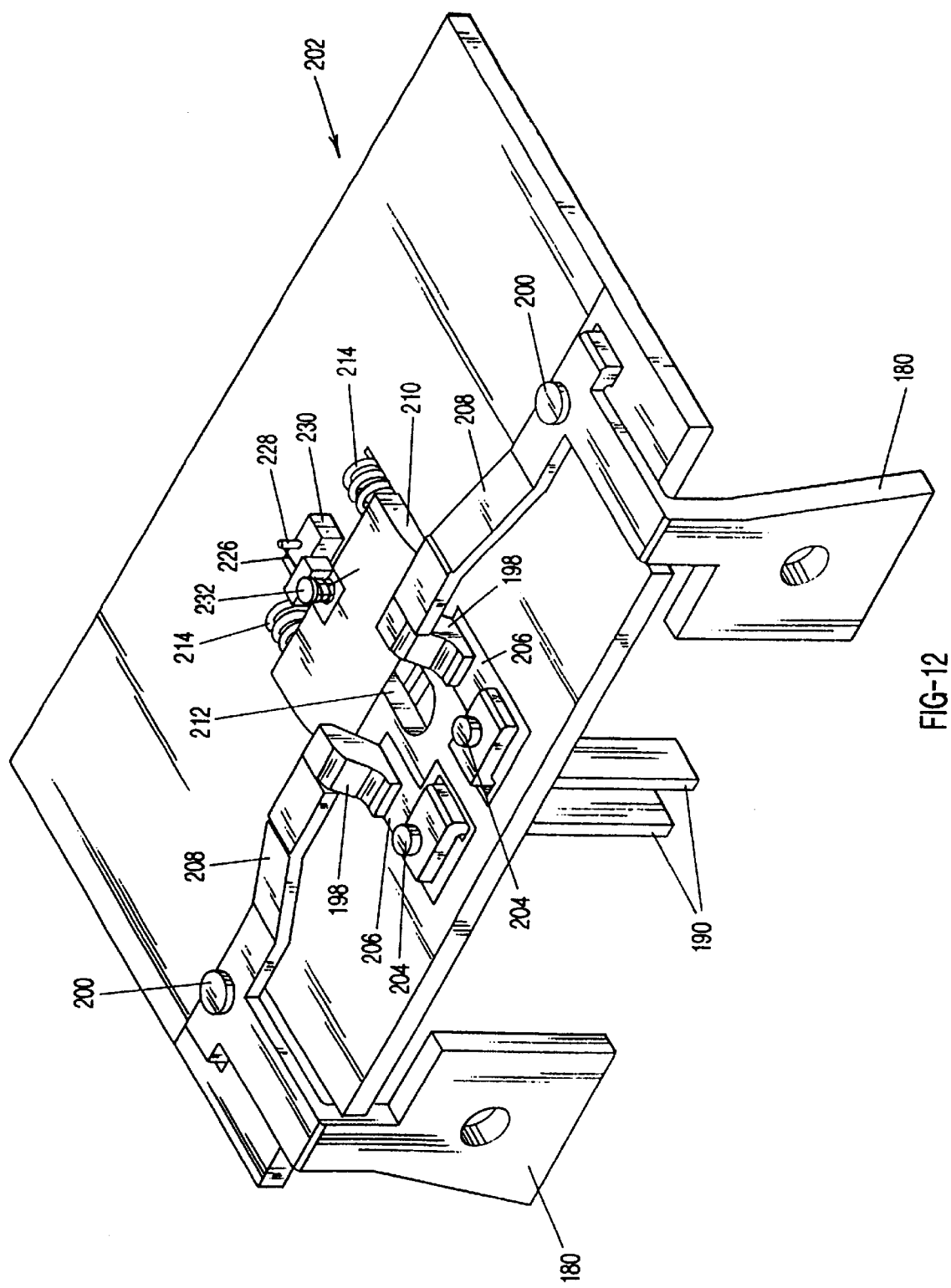
FIG. 12—One-shot breaker using shape memory alloy actuator.

FIG. 12 depicts a self-testing retrofit assembly of the invention analogous to the structure depicted in FIG. 10. As in the earlier figure, source terminal blocks 180 are connected to conducting blades 190 via conductors 208 which connect to contact points 198 which in turn make electrical contacts with copper pads 206. The conducting blades 190 connect to the GFCI electronics (not shown) and to the main circuit breaker (not shown). Rivets 200 and 204 serve to hold the conducting elements secure to the printed circuit board 202. When the one shot circuit breaker is activated, an insulating wedge 210 is forced by springs 214 to separate the contact points 198 from the copper pads 206, thereby breaking the electrical connection between the source terminals and the conducting blades 190. When the one-shot circuit breaker is activated, the insulating wedge 210 is allowed to move forward in a slot 212 in the printed circuit board 202. Prior to the activation of the one-shot circuit breaker, the springs 214 are in compression. Prior to the activation of the one-shot circuit breaker, the insulating wedge is prevented from moving by a large pin 232 which passes through the insulating wedge into a stationary structure 230.

Figure 13:
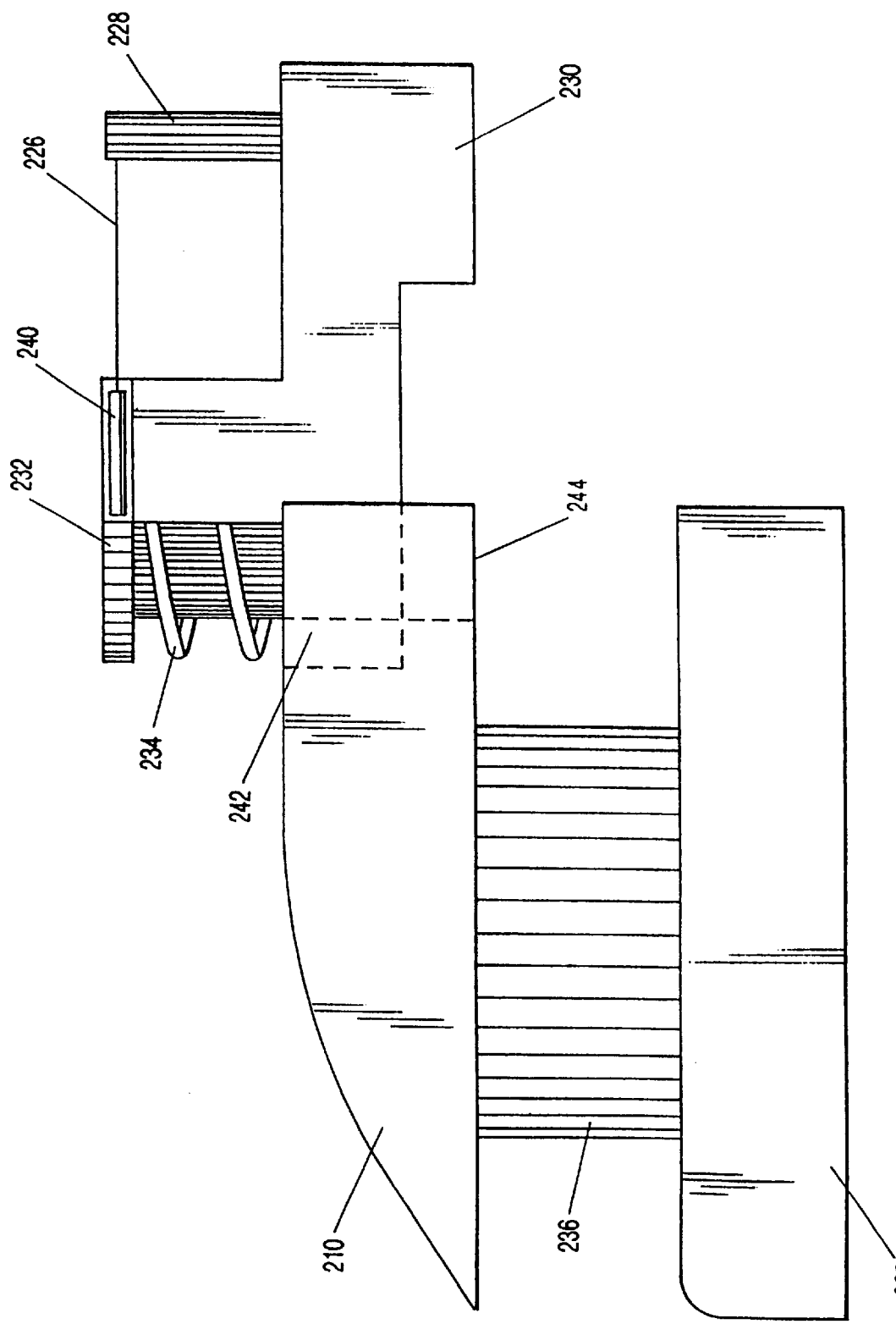
FIG. 13—Side view of one-shot breaker.

FIG. 13 presents a side view of the insulating wedge 210. The insulating wedge 210 is connected to a slide 236 that lies in a slot on the printed circuit board (not shown). Connecting to the slide 236 is a back plate 238 that goes on the back of the printed circuit board and gives stability. Stationary structure 230 is affixed to the printed circuit board. The stationary structure 230 extends into the insulating wedge (dotted line 242) and connects to the insulating wedge 210 through a large pin 232. The large pin 232 extends through the stationary structure 230 and into a hole in the wedge 210 that is located at position 244. When the large pin 232 is moved up out of the hole 244, it breaks the connection between the insulating wedge 210 and the stationary structure 230, and the insulating wedge is then free to move.

A compression spring 234 applies vertical force on large pin 232. Large pin 232 is prevented from moving by a small pin 240 that affixes the large pin to the stationary structure 230. The small pin is held in place by the pressure of the compression spring 234 pushing on the large pin 232. The small pin 240 can be displaced, thereby releasing the large pin 232, by a pulling force from the shape memory alloy wire 226. The shape memory alloy 226 is mechanically connected to a post 228 that in turn is rigidly connected to the stationary structure 230. The shape memory alloy wire 226 is nominally made out of a nickel titanium (nitinol) alloy. When heated past a characteristic transition temperature, the molecular structure of the wire changes from a martensitic state to an austenitic state, causing the wire to contract in length. The wire can be heated internally by an electrical connection from the one shot control.

Figure 14:
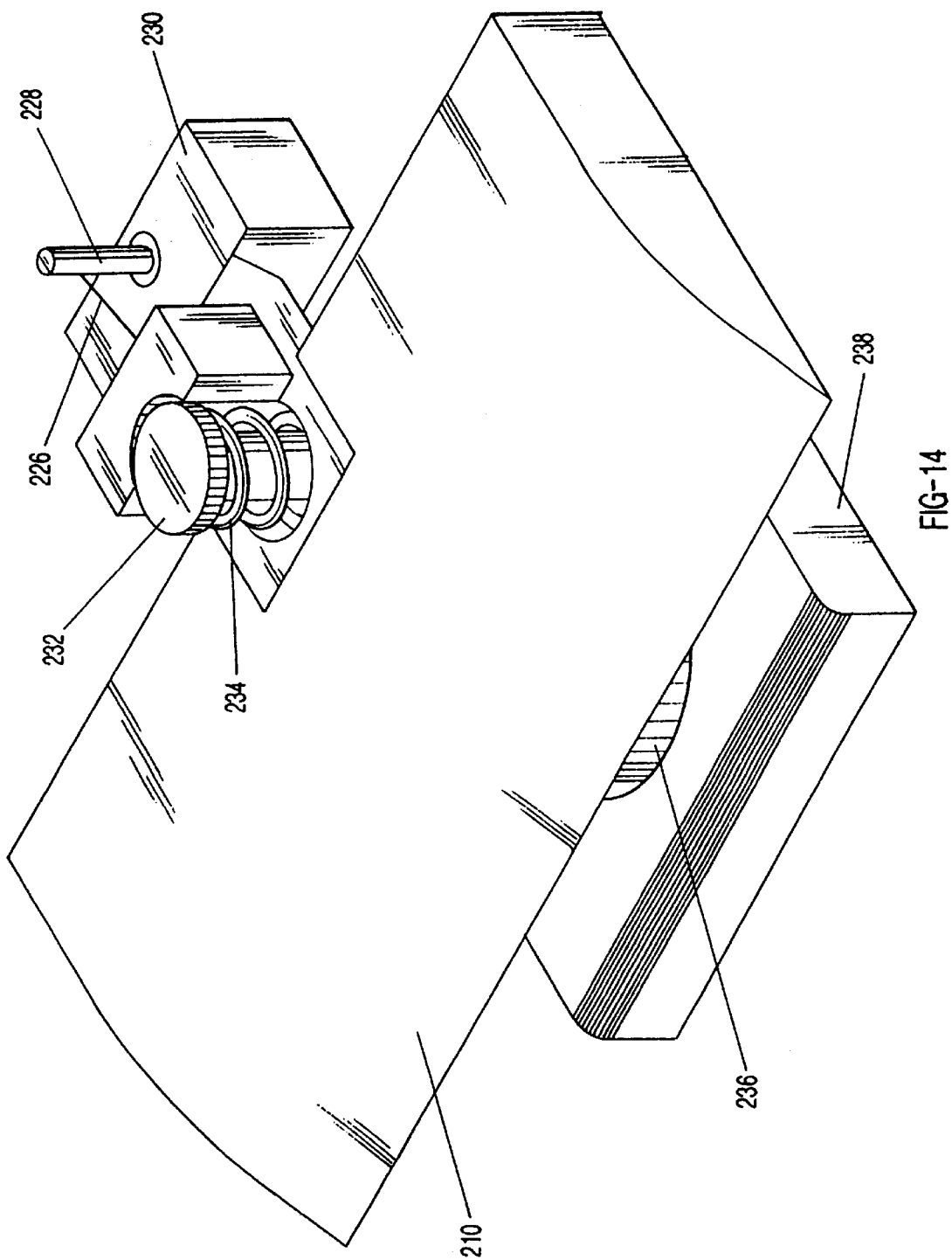
FIG. 14—Alternate view of one-shot breaker.

FIG. 14 gives an alternative view of the insulating wedge 210. The stationary structure 230 may be assumed to be in a fixed position. The wedge 210 is attached to the slide 236 and back plate 238 and can move away from the stationary structure 230. The wedge 210 and stationary structure 230 are held together by the large pin 232. The compression spring 234 applies a force on the large pin 232 in a direction that would release the large pin 232 and allow the wedge 210 to separate from the stationary structure 230. The large pin is released when a small pin (not shown) is pulled out of a retaining hole by a shape memory alloy wire 226.

Figure 15:
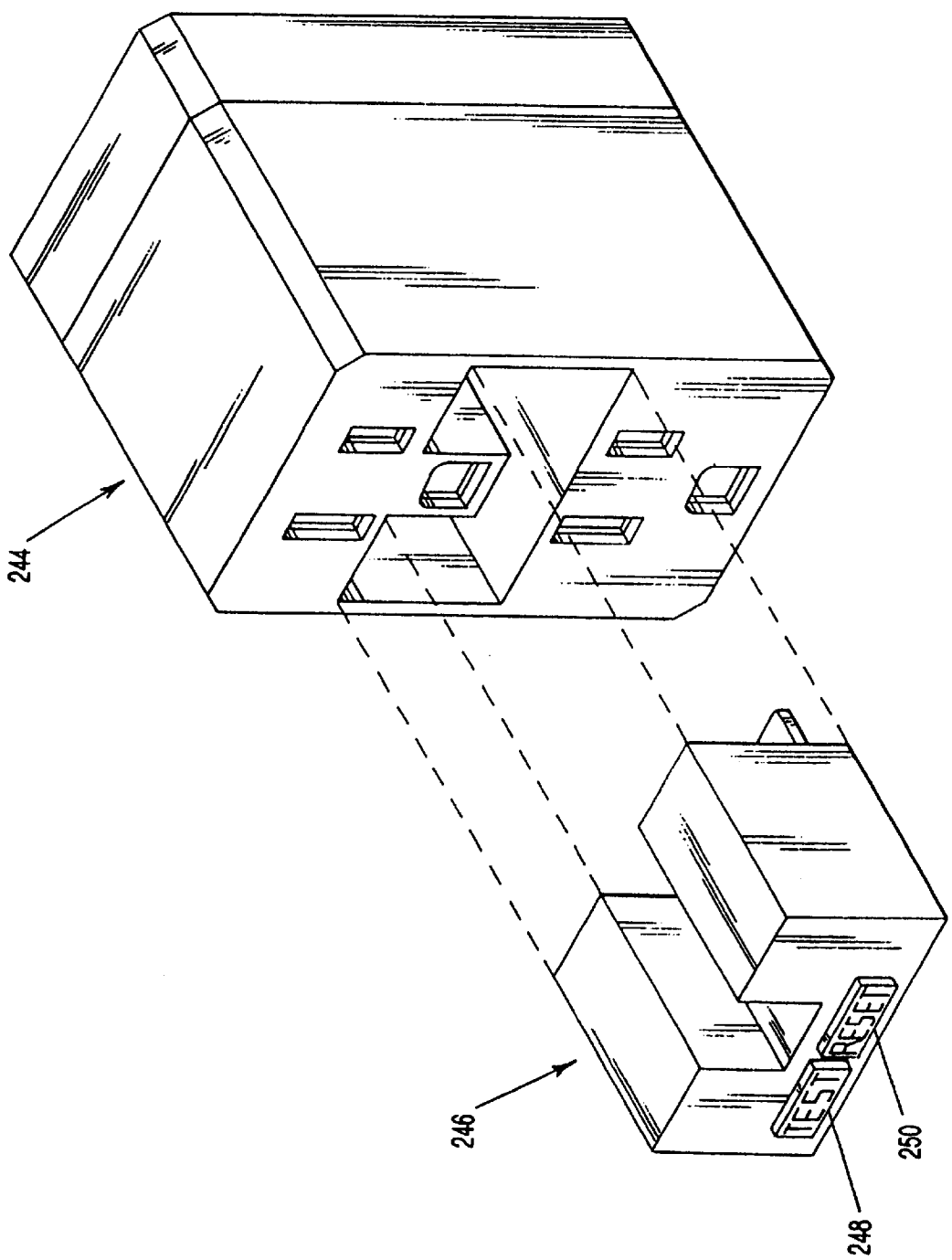
FIG. 15—Permanent outlet with removable GFCI/AFCI

FIG. 15 depicts a permanent wall outlet with a removable self-testing GFCI/AFCI component. The permanent outer shell 244 contains the outlets into which an appliance plug would be inserted. The GFCI and/or AFCI component 246 would contain both fault sensing electronics as well as self-testing electronics and the primary and secondary circuit breakers. When this removable component 246 is absent, or if either the primary or secondary circuit breakers within the removable component 246 are in an open state, the outlets in the permanent outer shell 244 are deenergized. The advantage to using this configuration is that in the case of a GFCI/AFCI malfunction, the outlet as a whole is easily repaired by simply replacing the removable component 246. Note that while a test button 248 and reset button 250 are depicted in FIG. 15, they are unnecessary if the removable component 246 contains a self-testing circuit.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A self-testing fault interrupt apparatus comprising:
a fault sensing component that detects an electrically unsafe operating condition;
a primary electrical current interrupting component for preventing power delivery upon the detection of an electrically unsafe operating condition;
a fault sense testing component that periodically and automatically disables the primary electrical current interrupting component, applies a simulated fault, verifies that the fault sensing component correctly detects this simulated fault, removes the simulated fault, and reenables the primary electrical current interrupting component if the fault sensing component correctly detected the simulated fault;
a circuit breaker testing component that, when the fault sensing component detects an electrically unsafe operating condition, automatically checks that the primary electrical current interrupting component has satisfactorily interrupted power delivery; and
a secondary electrical current interrupting component that permanently removes power from the self-testing fault interrupt apparatus if the fault sense testing component does not correctly detect a simulated fault or if the circuit breaker testing component determines that the primary electrical current interrupting component has not satisfactorily interrupted power delivery.

2. The apparatus of claim 1 wherein said fault sensing component detects a ground fault.

3. The apparatus of claim 2 wherein said fault sense testing component simulates a ground fault by imposing an electrical leakage path around a current sense transformer.

4. The apparatus of claim 1 wherein said fault sensing component detects an arcing fault.

5. The apparatus of claim 1 wherein said primary electrical current interrupting component comprises a solenoidal relay.

6. The apparatus of claim 5 wherein said fault sense testing component disables the primary electrical current interrupting component by disabling an actuating solenoid on said solenoidal relay.

7. The apparatus of claim 1 wherein said primary electrical current interrupting component comprises a member selected from the group consisting of solenoidal relays, bimetallic thermal circuit breakers, thermal magnetic circuit breakers, piezoelectric acutuated circuit breakers, shape memory alloy circuit breakers, or circuit breakers employing a fusible link.

8. The apparatus of claim 1 wherein said secondary current interrupting component comprises a one shot circuit breaker.

9. The apparatus of claim 1 wherein said secondary current interrupting component interrupts only one of two current carrying conductors.

10. The apparatus of claim 1 wherein said secondary current interrupting component comprises a member selected from the group consisting of solenoidal relays, bimetallic thermal circuit breakers, thermal magnetic circuit breakers, piezoelectric actuated circuit breakers, shape memory alloy actuated circuit breakers or circuit breakers employing a fusible link.

11. The apparatus of claim 1 wherein said secondary current interrupting component comprises conducting blades that are forced apart by an insulating wedge to interrupt power flow.

12. The apparatus of claim 11 wherein said insulating wedge is connected to a spring held in compression by a low wattage resistor.

13. The apparatus of claim 12 wherein said spring is released when a high electrical current is passed through said low wattage resistor.

14. The apparatus of claim 1 wherein said apparatus is connected to an outlet comprising manual test and reset means.

15. The apparatus of claim 1 wherein said apparatus is connected to an outlet not having manual test and reset means.

16. A self-testing fault interrupt method comprising the steps of:
a) detecting an electrically unsafe operating condition via a fault sensing component;
b) preventing power delivery upon the detection of an electrically unsafe operating condition via a primary electrical current interrupting component;
c) employing a fault sense testing component that periodically and automatically disables the primary electrical current interrupting component, applies a simulated fault, verifies that the fault sensing component correctly detects this simulated fault, removes the simulated fault, and reenables the primary electrical current interrupting component if the fault sensing component correctly detected the simulated fault;
d) employing a circuit breaker testing component that, when the fault sensing component detects an electrically unsafe operating condition, automatically checks that the primary electrical current interrupting component has satisfactorily interrupted power delivery; and
e) employing a secondary electrical current interrupting component that permanently removes power if the fault sense testing component does not correctly detect a simulated fault or if the circuit breaker testing component determines that the primary electrical current interrupting component has not satisfactorily interrupted power delivery.

17. The method of claim 16 wherein the detecting step detects a ground fault.

18. The method of claim 17 wherein the detecting step simulates a ground fault by imposing an electrical leakage path around a current sense transformer.

19. The method of claim 16 wherein the detecting step detects an arcing fault.

20. The method of claim 16 wherein the preventing step comprises preventing power delivery upon the detection of an electrically unsafe operating condition via a primary electrical current interrupting component comprising a solenoidal relay.

21. The method of claim 20 wherein the step of employing a fault sense testing component comprises disabling the primary electrical current interrupting component by disabling an actuating solenoid on the solenoidal relay.

22. The method of claim 16 wherein the step of employing a secondary electrical current interrupting component comprises employing a member selected from the group consisting of solenoidal relays, bimetallic thermal circuit breakers, thermal magnetic circuit breakers, piezoelectric acutated circuit breakers, shape memory alloy circuit breakers, or circuit breakers employing a fusible link.

23. The method of claim 16 wherein the step of employing a secondary current interrupting component comprises employing a one shot circuit breaker.

24. The method of claim 16 wherein the step of employing a secondary current interrupting component comprises interrupting only one of two current carrying conductors.

25. The method of claim 16 wherein the step of employing a secondary current interrupting component comprises employing a member selected from the group consisting of solenoidal relays, bimetallic thermal circuit breakers, thermal magnetic circuit breakers, piezoelectric actuated circuit breakers, shape memory alloy actuated circuit breakers or circuit breakers employing a fusible link.

26. The method of claim 16 wherein the step of employing a secondary current interrupting component comprises employing conducting blades that are forced apart by an insulating wedge to interrupt power flow.

27. The method of claim 26 wherein employing conducting blades comprises connecting the insulating wedge to a spring held in compression by a low wattage resistor.

28. The method of claim 27 wherein the connecting step comprises releasing the spring when a high electrical current is passed through the low wattage resistor.

29. The method of claim 16 additionally comprising providing an outlet comprising manual test and reset means.

30. The method of claim 16 additionally comprising providing an outlet not having manual test and reset means.

* * * * *